(12) United States Patent
Liaw

(10) Patent No.: US 12,159,872 B2
(45) Date of Patent: *Dec. 3, 2024

(54) IC INCLUDING STANDARD CELLS AND SRAM CELLS

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 180 days.

This patent is subject to a terminal disclaimer.

(21) Appl. No.: 17/815,847

(22) Filed: Jul. 28, 2022

(65) Prior Publication Data
US 2022/0375964 A1 Nov. 24, 2022

Related U.S. Application Data

(63) Continuation of application No. 17/086,562, filed on Nov. 2, 2020, now Pat. No. 11,476,278, which is a
(Continued)

(51) Int. Cl.
*H01L 27/118* (2006.01)
*H01L 27/092* (2006.01)
(Continued)

(52) U.S. Cl.
CPC .... *H01L 27/11807* (2013.01); *H01L 27/0924* (2013.01); *H01L 29/1037* (2013.01);
(Continued)

(58) Field of Classification Search
CPC ..... H01L 21/823418; H01L 21/823431; H01L 21/823814; H01L 21/823821; H01L 21/845; H01L 27/0886; H01L 27/0924; H01L 27/1104; H01L 27/11807; H01L 27/1211; H01L 29/1037; H01L 29/1608; H01L 29/165; H01L 29/167; H01L 29/24; H01L 29/267; H01L 29/41783; H01L 29/41791; H01L 29/66636; H01L 29/66795; H01L 29/7848; H01L 29/785; H01L 29/7851; H01L 29/7853;
(Continued)

(56) References Cited

U.S. PATENT DOCUMENTS 8,693,235 B2 4/2014 Liaw
9,613,953 B2 4/2017 Liaw
(Continued)

*Primary Examiner* — David C Spalla
(74) *Attorney, Agent, or Firm* — McClure, Qualey & Rodack, LLP

(57) ABSTRACT

An IC is provided. The IC includes a first P-type FinFET and a second P-type FinFET. The first P-type FinFET includes a silicon germanium channel region. The second P-type FinFET includes a Si channel region. First source/drain regions of the first P-type FinFET are formed on a discontinuous semiconductor fin, and second source/drain regions of the second P-type FinFET are formed on a continuous semiconductor fin. A first depth of the first source/drain regions is different from a second depth of the second source/drain regions.

20 Claims, 19 Drawing Sheets

Related U.S. Application Data continuation of application No. 16/513,857, filed on Jul. 17, 2019, now Pat. No. 10,825,835.

(51) Int. Cl.

| | |
|---|---|
| *H01L 27/11* | (2006.01) |
| *H01L 29/10* | (2006.01) |
| *H01L 29/16* | (2006.01) |
| *H01L 29/165* | (2006.01) |
| *H01L 29/167* | (2006.01) |
| *H01L 29/24* | (2006.01) |
| *H01L 29/267* | (2006.01) |
| *H01L 29/78* | (2006.01) |
| *H10B 10/00* | (2023.01) |

(52) U.S. Cl.
CPC ........ *H01L 29/1608* (2013.01); *H01L 29/165* (2013.01); *H01L 29/167* (2013.01); *H01L 29/24* (2013.01); *H01L 29/267* (2013.01); *H01L 29/7848* (2013.01); *H10B 10/12* (2023.02); *H01L 2027/11824* (2013.01); *H01L 2027/11831* (2013.01); *H01L 2027/11838* (2013.01)

(58) Field of Classification Search
CPC ......... H01L 29/7855; H01L 2029/7858; H01L 2027/11824; H01L 2027/11831; H01L 2027/11838

See application file for complete search history.

(56) References Cited

U.S. PATENT DOCUMENTS

| | | |
|---|---|---|
| 9,793,273 B2 | 10/2017 | Liaw |
| 9,805,985 B2 | 10/2017 | Liaw |
| 10,825,835 B1 * | 11/2020 | Liaw .................. H01L 29/7848 |
| 2010/0155855 A1 | 6/2010 | Anderson et al. |
| 2012/0068268 A1 | 3/2012 | Hsiao et al. |
| 2014/0239255 A1 | 8/2014 | Kang et al. |
| 2015/0318282 A1 | 11/2015 | Rodder et al. |
| 2016/0190136 A1 | 6/2016 | Peng et al. |
| 2017/0263722 A1 | 9/2017 | You et al. |
| 2019/0035908 A1 | 1/2019 | Liao |
| 2019/0131453 A1 | 5/2019 | Lin et al. |
| 2020/0006491 A1 | 1/2020 | Bomberger et al. |
| 2020/0161315 A1 | 5/2020 | Shen et al. |

\* cited by examiner

IC INCLUDING STANDARD CELLS AND SRAM CELLS

CROSS REFERENCE TO RELATED APPLICATIONS

This Application is a Continuation of application Ser. No. 17/086,562, filed on Nov. 2, 2020, now U.S. Pat. No. 11,476,278, which is a Continuation of application Ser. No. 16/513,857, filed on Jul. 17, 2019, now U.S. Pat. No. 10,825,835, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With increased down-scaling of the already very small SRAM cells, however, such requests are difficult to achieve.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
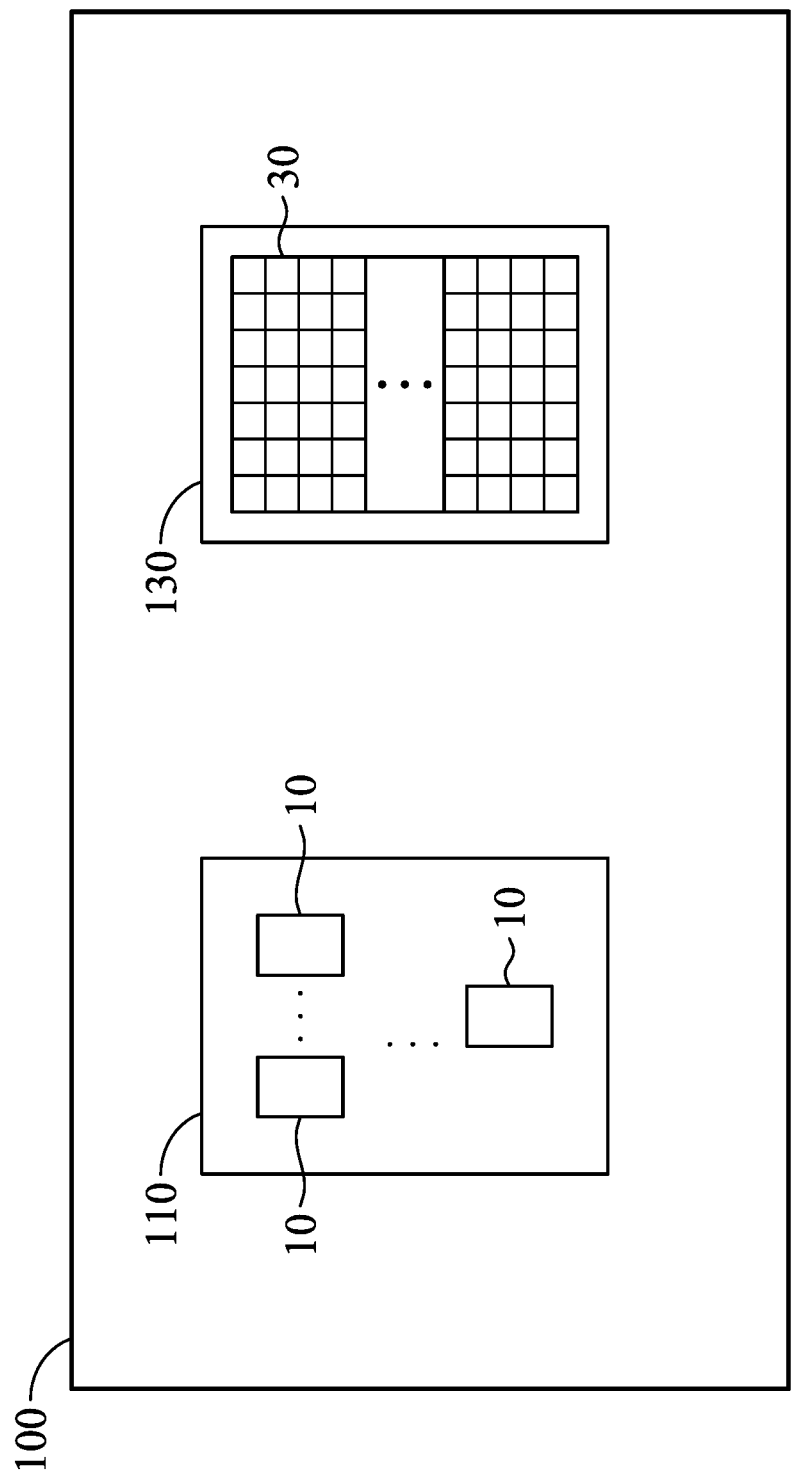
FIG. 1 is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1 is a simplified diagram of an IC 100, in accordance with some embodiments of the disclosure. The IC 100 includes a logic circuit 110 and a memory 130. In some embodiments, the logic circuit 110 may be the controller for accessing the memory 130. In some embodiments, the logic circuit 110 is configured to perform a specific function or operation according to data stored in the memory 130. The logic circuit 110 includes multiple logic cells 10. In some embodiments, the logic cell 10 may be a standard cell (STD cell), e.g., inverter (INV), AND, OR, NAND, NOR, Flip-Flop, SCAN and so on. In some embodiments, the logic cells 10 corresponding to the same function or operation may have the same circuit configuration with different semiconductor structures for providing various threshold voltages (Vth or Vt). For example, the semiconductor structures of the transistors in the logic cells 10a are different. In general, the threshold voltage of a field-effect transistor (FET) is the minimum gate-to-source voltage (VGS) that is needed to create a conducting path between the source and drain regions of the transistor.

In the IC 100, the memory 130 includes multiple memory cells 30 arranged in rows and columns of an array. In some embodiments, the memory cells 30 have the same circuit configuration and the same semiconductor structure. In some embodiments, the memory cell 30 may be a bit cell of SRAM.

Figure 2A:
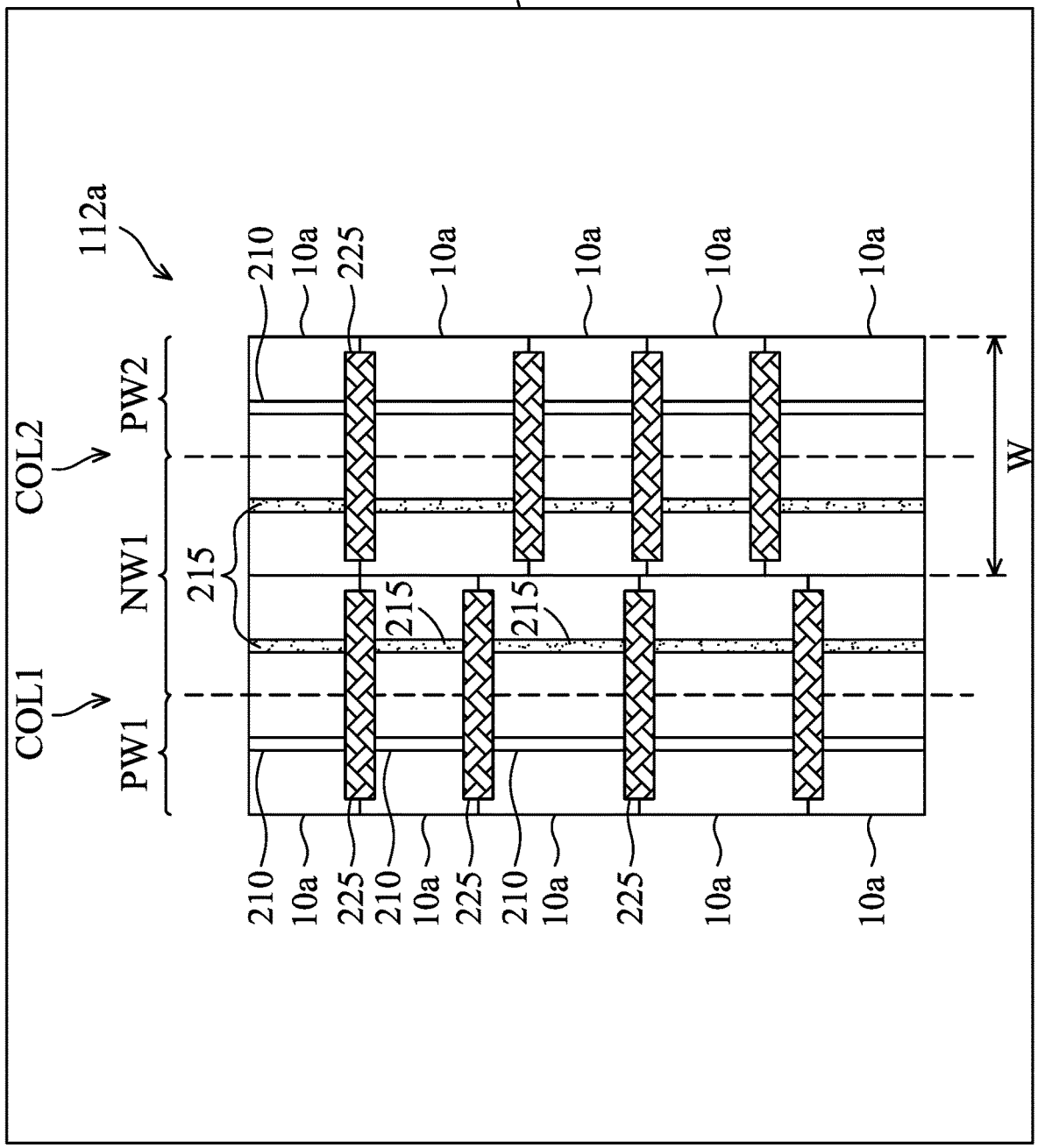
FIG. 2A is a simplified diagram of a logic circuit, in accordance with some embodiments of the disclosure.

FIG. 2A is a simplified diagram of a logic circuit 110A, in accordance with some embodiments of the disclosure. In the logic circuit 110A, multiple logic cells 10a form a cell array 112a, and the logic cells 10a have the same cell width W. The logic array 112a can be implemented in the logic circuit 110 of FIG. 1. In some embodiments, the logic array 112a is capable of performing a specific function. In some embodiments, the logic array 112a is capable of performing various functions. In some embodiments, each logic cell 10a is the standard cell (e.g., inverter (INV), AND, OR, NAND, NOR, Flip-Flop, SCAN, etc.), a combination thereof or specific functional cells. Furthermore, each logic cell 10a includes multiple transistors, i.e., PMOS and NMOS transistors.

In the logic array 112a, five logic cells 10a are positioned in the column COL1, and five logic cells 10a are positioned in the column COL2. The NMOS transistors (not shown) of the logic cells 10a in the column COL1 are formed over the P-type well region PW1, and the NMOS transistors (not shown) of the logic cells 10a in the column COL2 are formed over the P-type well region PW2. Moreover, the PMOS transistors (not shown) of the logic cells 10a in the columns COL1 and COL2 are formed over the N-type well region NW1.

In various embodiments, the columns in the logic array 112a may include more logic cells 10a or fewer logic cells 10a than the layout shown in FIG. 2A. In various embodiments, the logic array 112a may include more columns or fewer columns than the layout shown in FIG. 2A. Each logic cell 10a provides a circuit or portion thereof, exemplary functionality provided by the logic cells 10a includes, but are not limited to NAND circuit, a NOR circuit, AND circuit, XOR circuit, XNOR circuit, SACN, an inverter, a flip-flop, a latch, and/or other suitable logic or storage functions.

For the NMOS transistors in the logic cells 10a in the logic array 112a, the channel regions of the NMOS transistors are formed by the semiconductor fins 210 extending in the Y-direction. The semiconductor fins 210 are Si-base fins formed over the P-type well regions PW1 and PW2. For the logic cells 10a in the same column COL1/COL2, the semiconductor fin 210 of each logic cell 10a is separated from the semiconductor fins 210 of other logic cells 10a by a dielectric-base gate 225 extending in the X-direction. In other words, the semiconductor fins 210 are discontinuous fin lines in the logic cells 10a arranged in the same column COL1/COL2. The dielectric-base gate 225 is positioned between the cell boundary of two adjacent logic cells 10a. In some embodiments, the width of the semiconductor fins 210 is from about 3 nm to about 12 nm.

For the PMOS transistors in the logic cells 10a in the logic array 112a, the channel regions of the PMOS transistors are formed by the semiconductor fins 215 extending in the Y-direction. The semiconductor fins 215 are SiGe fins formed over the N-type well region NW1. For the logic cells 10a in the same column COL1/COL2, the semiconductor fin 215 of each logic cell 10a is separated from the semiconductor fins 215 of other logic cells 10a by a dielectric-base gate 225 extending in the X-direction. In other words, the semiconductor fins 215 are discontinuous fin lines in the logic cells 10a in the same column COL1/COL2. The dielectric-base gates 225 are described below. In some embodiments, the width of the semiconductor fins 215 is from about 3 nm to about 12 nm. In some embodiments, the width of the semiconductor fins 210 is narrower than the width of the semiconductor fins 215.

The semiconductor fins 210/215 may be patterned by any suitable method. For example, the semiconductor fins 210/215 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fins 210/215.

Figure 2B:
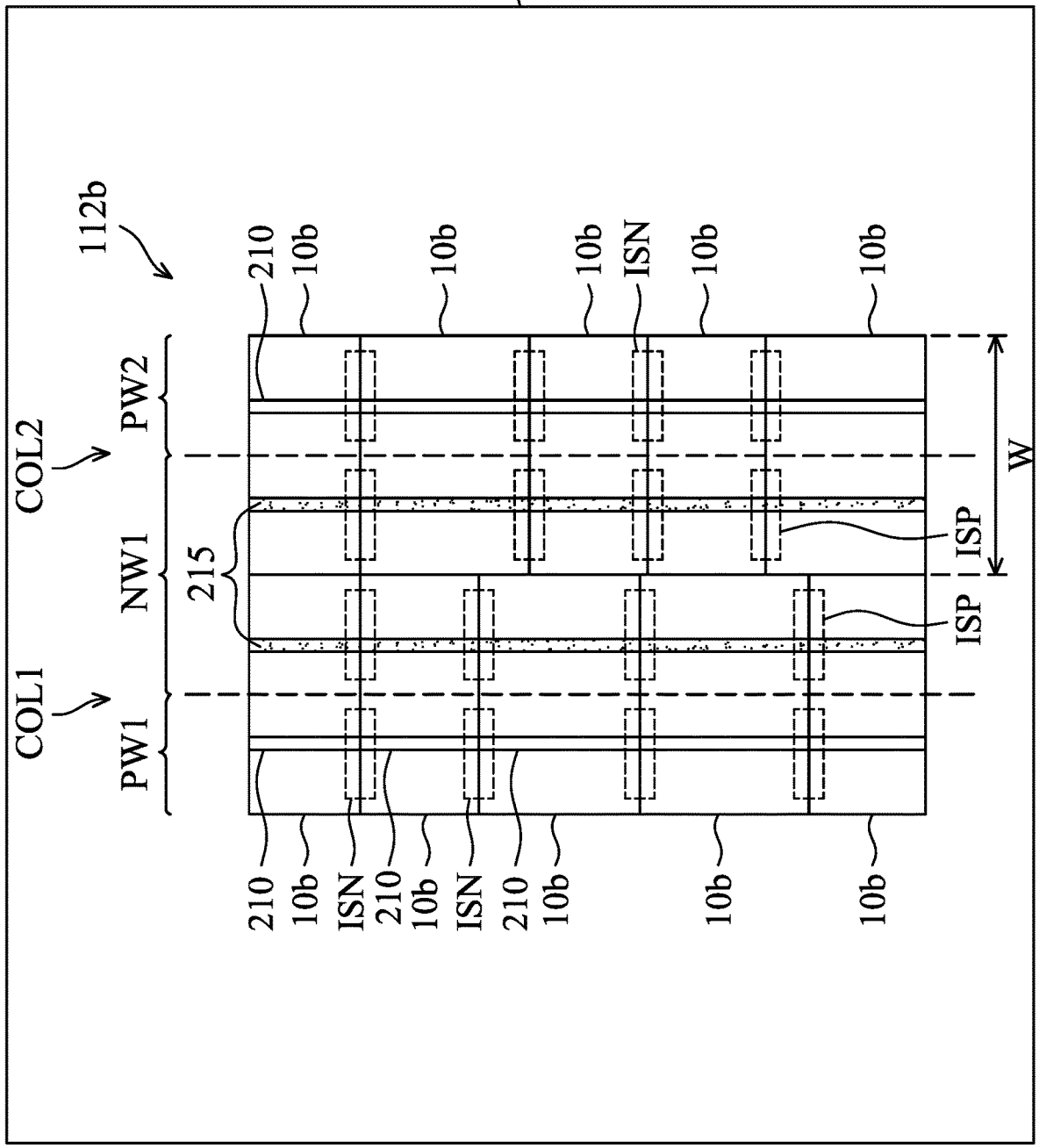
FIG. 2B is a simplified diagram of a logic circuit, in accordance with some embodiments of the disclosure.

FIG. 2B is a simplified diagram of a logic circuit 110B, in accordance with some embodiments of the disclosure. In the logic circuit 110B, multiple logic cells 10b form a cell array 112b, and the logic cells 10b have the same cell width W. The logic array 112b can be implemented in the logic circuit 110 of FIG. 1. In some embodiments, the logic array 112b is capable of performing a specific function. In some embodiments, the logic array 112b is capable of performing various functions. In some embodiments, the logic cell 10b is the standard cell (e.g., inverter (INV), AND, OR, NAND, NOR, Flip-Flop, SCAN, etc.), a combination thereof or specific functional cells. Furthermore, each of the logic cells 10b includes multiple transistors, i.e., PMOS and NMOS transistors.

The configuration of logic cells 10b in the logic array 112b of the logic circuit 110B is similar to the configuration of logic cells 10a in the logic array 112a of the logic circuit 110A of FIG. 2A. The difference between the logic array 112b and the logic array 112a is that the semiconductor fins 210 and 215 are continuous fin lines in the logic cells 10b in the same column COL1/COL2. In other words, the semiconductor fins 210 and 215 do not broken by the dielectric-base gates 225, and each semiconductor fin 210/215 is shared by the transistors over the same well region. For example, the semiconductor fin 210 over the P-type well region PW1 is shared by the NMOS transistors of the logic cells 10b in the column COL1, and the semiconductor fin 215 over the N-type well region NW1 is shared by the PMOS transistors of the logic cells 10b in the column COLL. Furthermore, the isolation NMOS transistors ISN and the isolation PMOS transistors ISP are located between the cell boundary of two adjacent logic cells 10b for device isolation purposes. The isolation NMOS transistors ISN and the isolation PMOS transistors ISP are described below.

In some embodiments, the logic array 112a of FIG. 2A and the logic array 112b of FIG. 2B can be simultaneously implemented in the logic circuit 110 of FIG. 1.

Figure 3A:
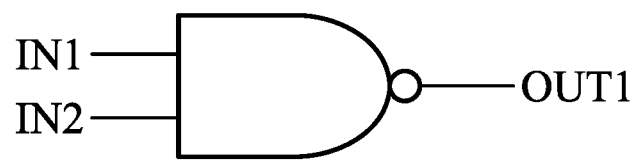
FIG. 3A illustrates the logic symbol of the standard cell NAND.
Figure 3B:
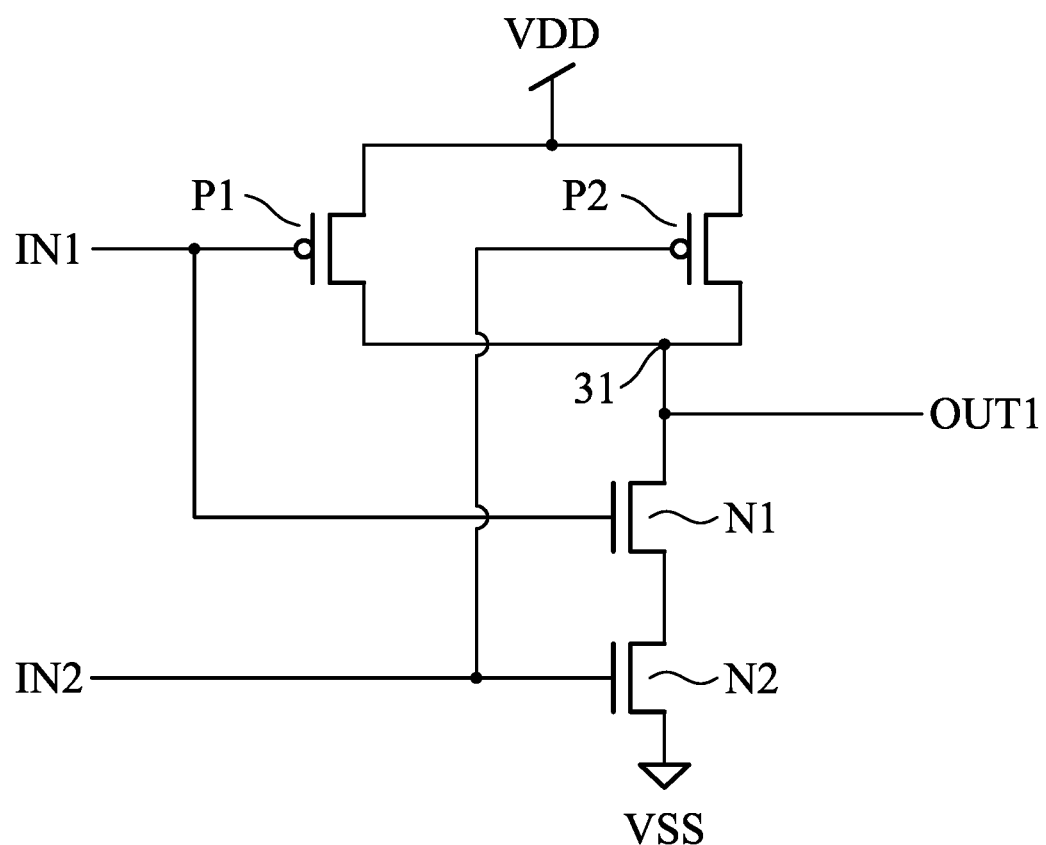
FIG. 3B is a circuit diagram of the standard cell NAND in FIG. 3A.

FIG. 3A illustrates the logic symbol of the standard cell NAND. FIG. 3B is a circuit diagram of the standard cell NAND in FIG. 3A. The standard cell NAND is a logic gate configured to provide an output signal OUT1 according two input signals IN1 and IN2. The standard cell NAND includes two PMOS transistors P1 and P2 and two NMOS transistors N1 and N2. In some embodiments, the two PMOS transistors P1 and P2 and two NMOS transistors N1 and N2 may be the FinFETs with single fin or multiple-fin.

In the standard cell NAND, the PMOS transistors P1 and P2 are coupled in parallel between a node 31 and a power supply VDD. The NMOS transistor N1 is coupled between the node 31 and the NMOS transistor N2, and the NMOS transistor N2 is coupled between the NMOS transistor N1 and a ground VSS. The input signal IN1 is input to the gates of the PMOS transistor P1 and the NMOS transistor N1, and the input signal IN2 is input to the gates of the PMOS transistor P2 and the NMOS transistor N2. Furthermore, the output signal OUT1 is provided at the node 31.

Figure 4A:
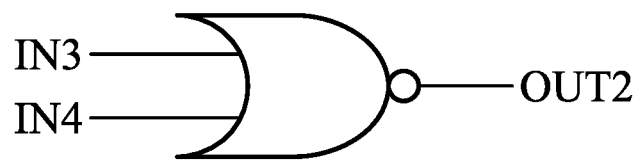
FIG. 4A illustrates the logic symbol of the standard cell NOR.
Figure 4B:
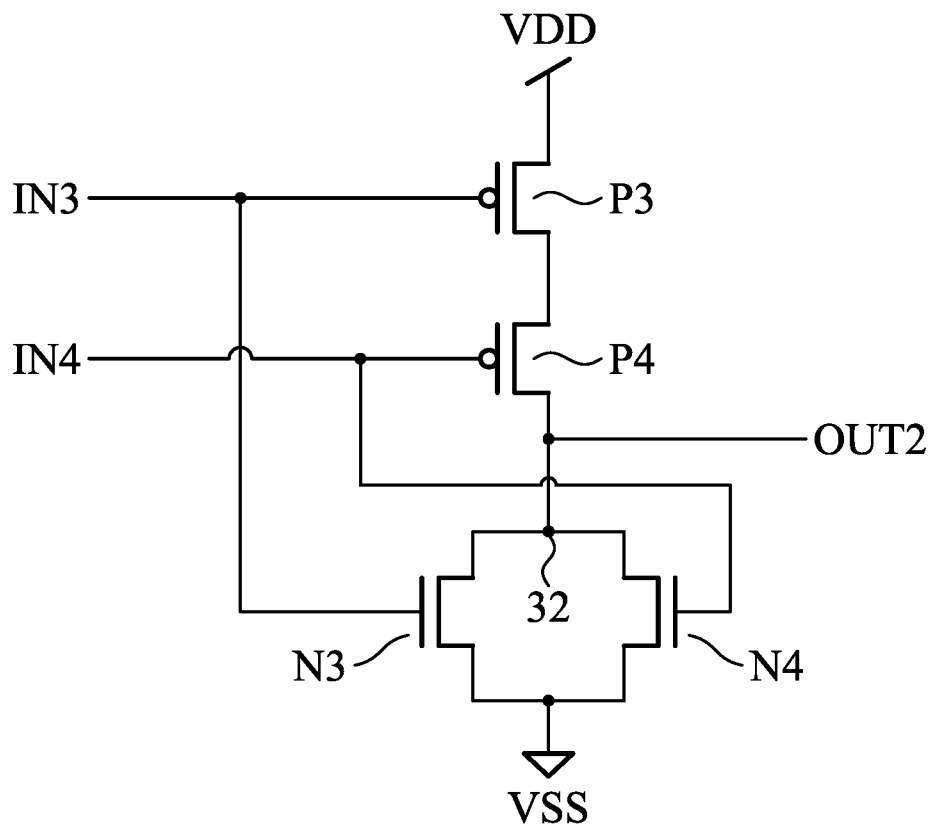
FIG. 4B is a circuit diagram of the standard cell NOR in FIG. 4A.

FIG. 4A illustrates the logic symbol of the standard cell NOR. FIG. 4B is a circuit diagram of the standard cell NOR in FIG. 4A. The standard cell NOR is a logic gate configured to provide an output signal OUT2 according two input signals IN3 and IN4. The standard cell NOR includes two PMOS transistors P3 and P4 and two NMOS transistors N3 and N4. In some embodiments, the two PMOS transistors P3 and P4 and two NMOS transistors N3 and N4 may be the FinFETs with single fin or multiple-fin.

In the standard cell NOR, the PMOS transistor P3 is coupled between a power supply VDD and the PMOS transistor P4, and the PMOS transistor P4 is coupled between the PMOS transistor P3 and a node 32. The NMOS transistors N3 and N4 are coupled in parallel between the node 32 and a ground VSS. The input signal IN3 is input to the gates of the PMOS transistor P3 and the NMOS transistor N3, and the input signal IN4 is input to the gates of the PMOS transistor P4 and the NMOS transistor N4. Furthermore, the output signal OUT2 is provided at the node 32.

Figure 5A:
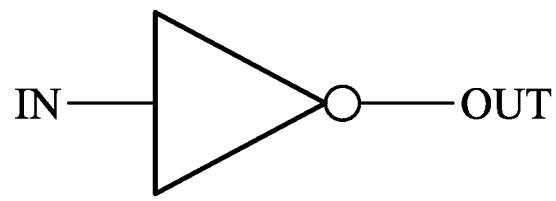
FIG. 5A illustrates the logic symbol of the standard cell INV (i.e., inverter).
Figure 5B:
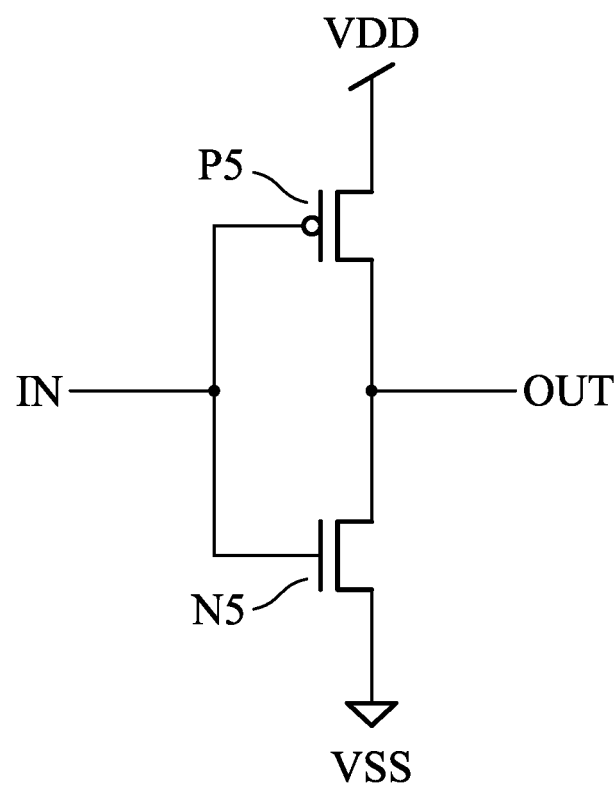
FIG. 5B is a circuit diagram of the standard cell INV in FIG. 5A.

FIG. 5A illustrates the logic symbol of the standard cell INV (i.e., inverter). FIG. 5B is a circuit diagram of the standard cell INV in FIG. 5A. The standard cell INV is a logic gate configured to inverting an input signal IN to provide an output signal OUT. The standard cell INV includes a PMOS transistor P5 and an NMOS transistor N5.

In some embodiments, the PMOS transistor P5 and the NMOS transistors N5 may be the FinFETs with single fin or multiple-fin.

In the standard cell INV, the PMOS transistor P5 is coupled between the NMOS transistor N5 and a power supply VDD. The NMOS transistor N5 is coupled between the PMOS transistor P5 and a ground VSS. The input signal IN is input to the gates of the PMOS transistor P5 and the NMOS transistor N5. Furthermore, the output signal OUT is provided at the drains of the NMOS transistor N5 and the PMOS transistor P5.

Figure 6:
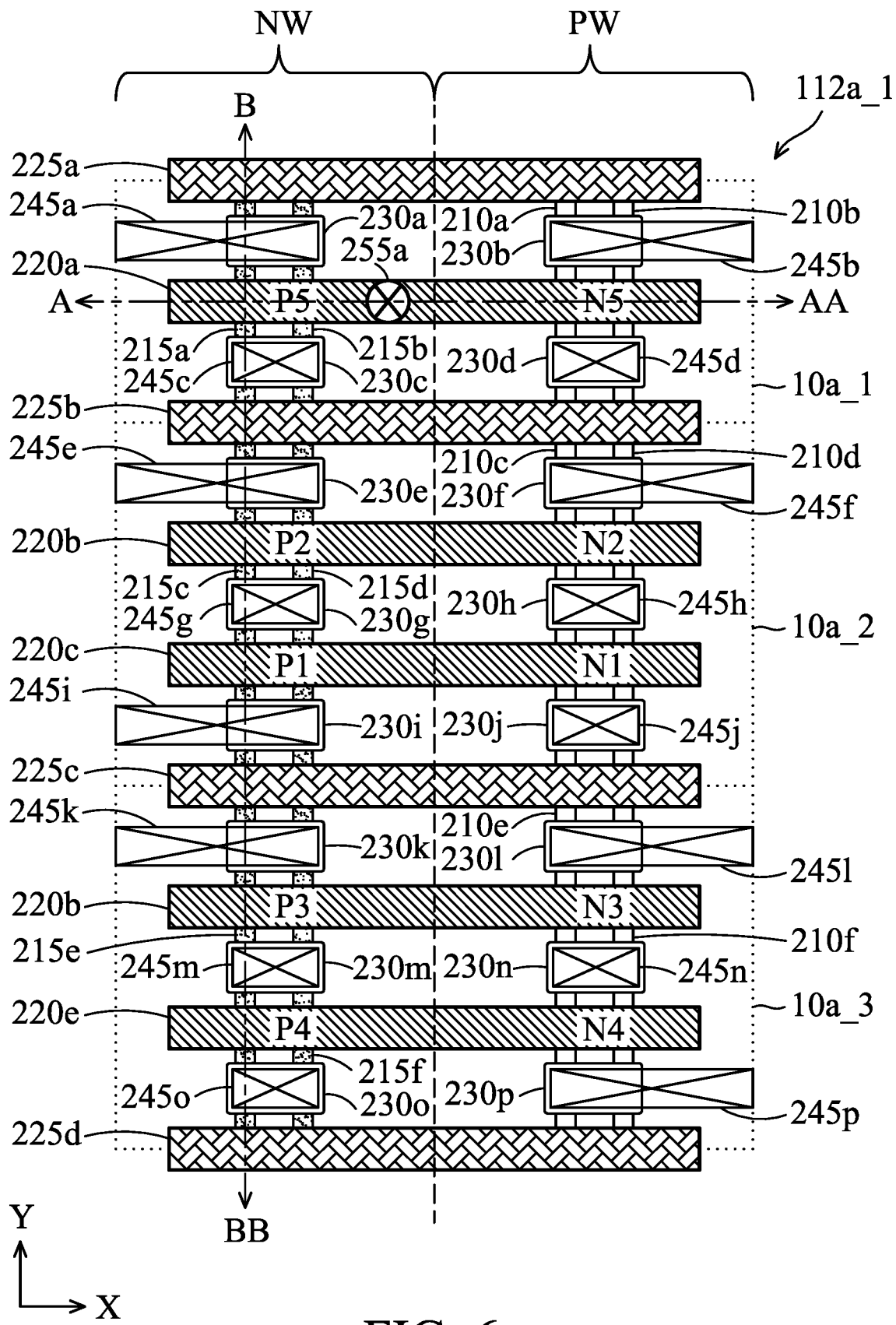
FIG. 6 illustrates the layout of the semiconductor structure of a cell array, in accordance with some embodiments of the disclosure.

FIG. 6 illustrates the layout of the semiconductor structure of a cell array 112a_1, in accordance with some embodiments of the disclosure. The logic array 112a_1 includes the logic cells 10a_1, 10a_2 and 10a_3 arranged in the same column. The logic array 112a_1 can be implemented in the logic circuit 110 of FIG. 1. In some embodiments, the standard cell INV of FIGS. 5A and 5B is implemented in the logic cell 10a_1, the standard cell NAND of FIGS. 3A and 3B is implemented in the logic cell 10a_2, and the standard cell NOR of FIGS. 4A and 4B is implemented in the logic cell 10a_3. In such embodiments, the transistors of the logic cells 10a_1 through 10a_3 are dual-fin FETs. Furthermore, the outer boundary of each of the logic cells 10a_1 through 10a_3 is illustrated using dashed lines.

In various embodiments, the columns in the logic array 112a_1 may include more logic cells 10a or fewer logic cells 10a than the layout shown in FIG. 6. In various embodiments, the logic array 112a_1 may include more rows or fewer rows and more columns or fewer columns than the layout shown in FIG. 6. Each logic cell 10a provides a circuit or portion thereof, exemplary functionality provided by the logic cells 10a includes, but are not limited to NAND circuit, a NOR circuit, AND circuit, XOR circuit, XNOR circuit, SACN, an inverter, a flip-flop, a latch, and/or other suitable logic or storage functions.

In the logic cell 10a_1, the semiconductor fins 215a and 215b extending in the Y-direction are formed over the N-type well region NW, and the semiconductor fins 210a and 210b extending in the Y-direction are formed over the P-type well region PW. As described above, the semiconductor fins 210a and 210b are Si-base fins, and the semiconductor fins 215a and 215b are SiGe fins. A gate electrode 220a extending in the X-direction forms the PMOS transistor P5 with an underlying active region formed by the semiconductor fins 215a and 215b over the N-type well region NW. Furthermore, the gate electrode 220a forms the NMOS transistor N5 with an underlying active region formed by the semiconductor fins 210a and 210a over the P-type well region PW. In other words, the gate electrode 220a is shared by the NMOS transistor N5 and the PMOS transistor P5. In some embodiments, the gate electrode 220a is coupled to a conductive line (not shown) extending in the Y-direction through a gate contact 255a, and the conductive line is configured to connect the gate electrode 220a to an overlying level for receiving the input signal IN.

In the logic cell 10a_1, the source/drain region 230a of the PMOS transistor P5 is coupled to an overlying level through the contact 245a for coupling the power supply VDD. Furthermore, the source/drain region 230c of the PMOS transistor P5 is coupled to an overlying level through the contact 245c. Similarly, the source/drain region 230b of the NMOS transistor N5 is coupled to an overlying level through the contact 245b for coupling the ground VSS.

Moreover, the source/drain region 230d of the NMOS transistor N5 is coupled to an overlying level through the contact 245d.

In the logic cell 10a_1, the dielectric-base gates 225a and 225b extending in the X-direction are dummy gates. The gate electrode 220a is arranged between the dielectric-base dummy gates 225a and 225b, and the NMOS transistor N5 and the PMOS transistor P5 are surrounded by the dielectric-base dummy gates 225a and 225b. In other words, the dielectric-base dummy gates 225a and 225b are arranged in the boundary of the logic cell 10a_1.

In the logic cell 10a_2, the semiconductor fins 215c and 215d extending in the Y-direction are formed over the N-type well region NW, and the semiconductor fins 210c and 210d extending in the Y-direction are formed over the P-type well region PW. As described above, the semiconductor fins 210c and 210d are Si-base fins, and the semiconductor fins 215c and 215d are SiGe fins. A gate electrode 220b extending in the X-direction forms the PMOS transistor P2 with an underlying active region formed by the semiconductor fins 215c and 215d over the N-type well region NW. Furthermore, the gate electrode 220b forms the NMOS transistor N2 with an underlying active region formed by the semiconductor fins 210c and 210d over the P-type well region PW. In other words, the gate electrode 220b is shared by the NMOS transistor N2 and the PMOS transistor P2. In some embodiments, the gate electrode 220b is coupled to a conductive line (not shown) extending in the Y-direction through a gate contact (not shown), and the conductive line is configured to connect the gate electrode 220b to an overlying level for receiving the input signal IN2.

In the logic cell 10a_2, a gate electrode 220c extending in the X-direction forms the PMOS transistor P1 with an underlying active region formed by the semiconductor fins 215c and 215d over the N-type well region NW. Furthermore, the gate electrode 220b forms the NMOS transistor N1 with an underlying active region formed by the semiconductor fins 210c and 210d over the P-type well region PW. In other words, the gate electrode 220c is shared by the NMOS transistor N1 and the PMOS transistor P1. In some embodiments, the gate electrode 220c is coupled to a conductive line (not shown) extending in the Y-direction through a gate contact (not shown), and the conductive line is configured to connect the gate electrode 220c to an overlying level for receiving the input signal IN1.

In the logic cell 10a_2, the source/drain region 230e of the PMOS transistor P2 is coupled to an overlying level through the contact 245e for coupling the power supply VDD. Similarly, the source/drain region 230i of the PMOS transistor P1 is coupled to an overlying level through the contact 245i for coupling the power supply VDD. Furthermore, the source/drain region 230f of the NMOS transistor N2 is coupled to an overlying level through the contact 245f for coupling the ground VSS. Moreover, the source/drain region 230j of the NMOS transistor N1 is coupled to an overlying level through the contact 245j.

The source/drain region 230g is a common source/drain region for the PMOS transistors P1 and P2, and the source/drain region 230g is coupled to an overlying level through the contact 245g. Moreover, the source/drain region 230h is a common source/drain region for the NMOS transistors N1 and N2. And the source/drain region 230h is coupled to an overlying level through the contact 245h.

In the logic cell 10a_2, the dielectric-base gates 225b and 225c extending in the X-direction are dummy gates. The gate electrodes 220b and 220c are arranged between the dielectric-base dummy gates 225b and 225c, and the NMOS transistors N1 and N2 and the PMOS transistors P1 and P2 are surrounded by the dielectric-base dummy gates 225b and 225c. In other words, the dielectric-base dummy gates 225b and 225c are arranged in the boundary of the logic cell 10a_2. Furthermore, the semiconductor fins 215a and 215b in the logic cell 10a_1 are separated from the semiconductor fins 215c and 215d in the logic cell 10a_2 by the dielectric-base dummy gate 225b. Similarly, the semiconductor fins 210a and 210b in the logic cell 10a_1 are also separated from the semiconductor fins 210c and 210d in the logic cell 10a_2 by the dielectric-base dummy gate 225b.

In the logic cell 10a_3, the semiconductor fins 215e and 215f extending in the Y-direction are formed over the N-type well region NW, and the semiconductor fins 210e and 210f extending in the Y-direction are formed over the P-type well region PW. As described above, the semiconductor fins 210e and 210f are Si-base fins, and the semiconductor fins 215e and 215f are SiGe fins. A gate electrode 220d extending in the X-direction forms the PMOS transistor P3 with an underlying active region formed by the semiconductor fins 215e and 215f over the N-type well region NW. Furthermore, the gate electrode 220d forms the NMOS transistor N3 with an underlying active region formed by the semiconductor fins 210e and 210f over the P-type well region PW. In other words, the gate electrode 220d is shared by the NMOS transistor N3 and the PMOS transistor P3. In some embodiments, the gate electrode 220d is coupled to a conductive line (not shown) extending in the Y-direction through a gate contact (not shown), and the conductive line is configured to connect the gate electrode 220d to an overlying level for receiving the input signal IN3.

In the logic cell 10a_3, a gate electrode 220e extending in the X-direction forms the PMOS transistor P4 with an underlying active region formed by the semiconductor fins 215e and 215f over the N-type well region NW. Furthermore, the gate electrode 220e forms the NMOS transistor N4 with an underlying active region formed by the semiconductor fins 210e and 210f in the P-type well region PW. In other words, the gate electrode 220e is shared by the NMOS transistor N4 and the PMOS transistor P4. In some embodiments, the gate electrode 220e is coupled to a conductive line (not shown) extending in the Y-direction through a gate contact (not shown), and the conductive line is configured to connect the gate electrode 220e to an overlying level for receiving the input signal IN4.

In the logic cell 10a_3, the source/drain region 230k of the PMOS transistor P3 is coupled to an overlying level through the contact 245k for coupling the power supply VDD. Furthermore, the source/drain region 230l of the NMOS transistor N3 is coupled to an overlying level through the contact 245l for coupling the ground VSS. Similarly, the source/drain region 230p of the NMOS transistor N4 is coupled to an overlying level through the contact 245p for coupling the ground VSS. Moreover, the source/drain region 230o of the PMOS transistor P4 is coupled to an overlying level through the contact 245o.

The source/drain region 230m is a common source/drain region for the PMOS transistors P3 and P4, and the source/drain region 230m is coupled to an overlying level through the contact 245m. Moreover, the source/drain region 230n is a common source/drain region for the NMOS transistors N3 and N4. And the source/drain region 230n is coupled to an overlying level through the contact 245n.

In the logic cell 10a_3, the dielectric-base gates 225c and 225d extending in the X-direction are dummy gates. The gate electrodes 220d and 220e are arranged between the dielectric-base dummy gates 225c and 225d, and the NMOS transistors N3 and N4 and the PMOS transistors P3 and P4 are surrounded by the dielectric-base dummy gates 225c and 225d. In other words, the dielectric-base dummy gates 225c and 225d are arranged in the boundary of the logic cell 10a_3. Furthermore, the semiconductor fins 215c and 215d in the logic cell 10a_2 are separated from the semiconductor fins 215e and 215f in the logic cell 10a_3 by the dielectric-base dummy gate 225c. Similarly, the semiconductor fins 210c and 210d in the logic cell 10a_2 are also separated from the semiconductor fins 210e and 210f in the logic cell 10a_3 by the dielectric-base dummy gate 225d.

Figure 7A:
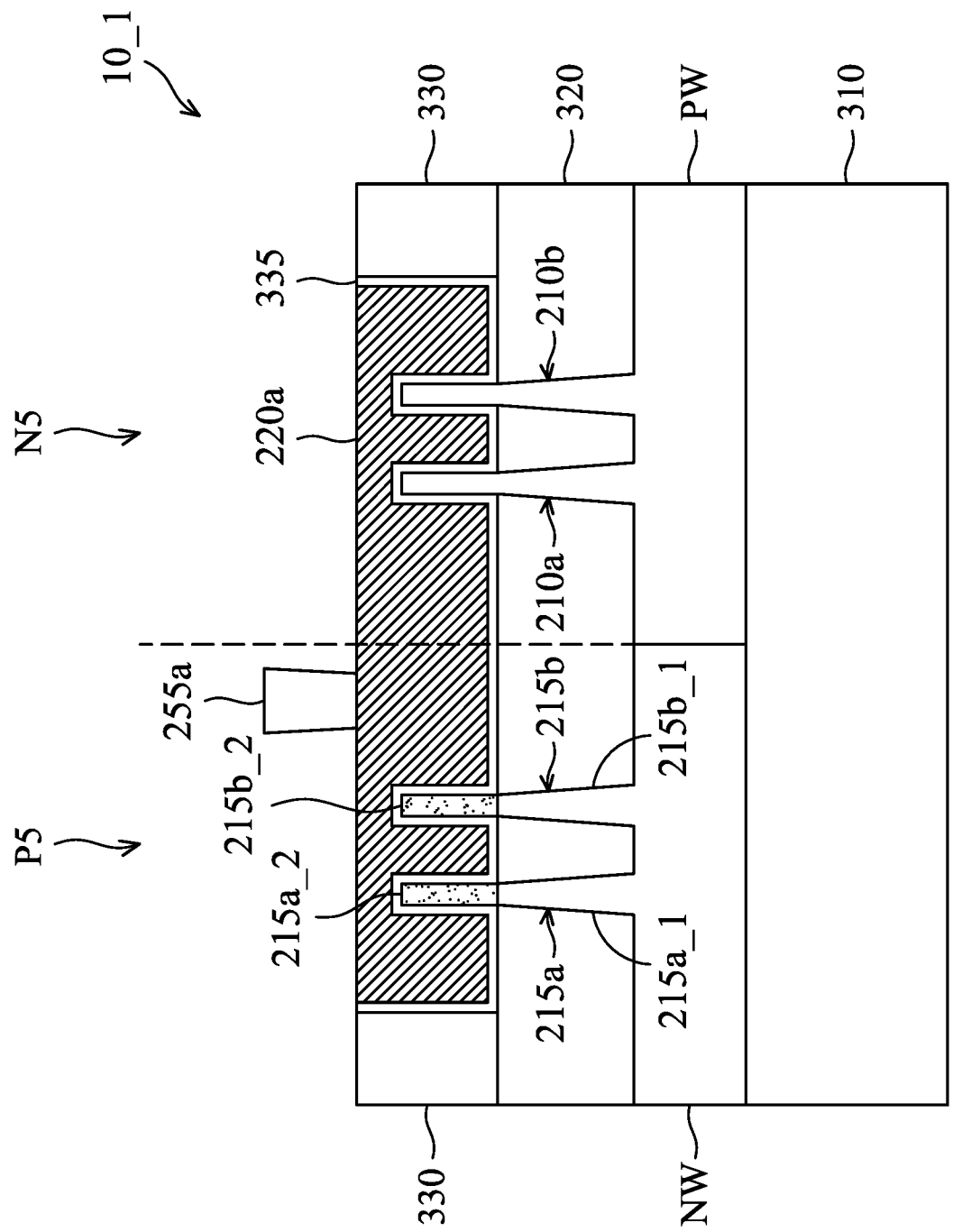
FIG. 7A illustrates a cross-sectional view of the semiconductor structure of the logic array along line A-AA in FIG. 6, in accordance with some embodiments of the disclosure.

FIG. 7A illustrates a cross-sectional view of the semiconductor structure of the logic array 112a_1 along line A-AA in FIG. 6, in accordance with some embodiments of the disclosure. The P-type well region PW and the N-type well region NW are formed over a substrate 310. In some embodiments, the substrate 310 is a Si substrate. In some embodiments, the material of the substrate 310 is selected from a group consisting of bulk-Si, SiP, SiGe, SiC, SiPC, Ge, SOI—Si, SOI—SiGe, III-VI material, and combinations thereof.

The semiconductor fins 215a and 215b are formed on the N-type well region NW. The semiconductor fins 215a and 215b are separated from each other by the shallow trench isolation (STI) 320. The semiconductor fin 215a includes a first portion 215a_1 and a second portion 215a_2. Unlike the first portion 215a_1, the second portion 215a_2 further includes SiGe. Similarly, the semiconductor fin 215b includes a first portion 215b_1 and a second portion 215b_2. Unlike the first portion 215b_1, the second portion 215b_2 further includes SiGe. In some embodiments, the Ge atomic concentration of the second portions 215a_2 and 215b_2 is from about 5% to about 45%. In some embodiments, the second portions 215a_2 and 215b_2 are formed by performing a dielectric deposition, patterning to expose the predetermined channel region and following a first SiGe concentration epi-growth on exposed channel region. For example, using mask to etch a predetermined area on the Si substrate 310 with a depth (e.g., 40 nm to 70 nm), and then the non-etch portion is blocked. Next, the SiGe epitaxy growth material is formed for the second portions 215a_2 and 215b_2, and then subsequent processes are performed to form the STI 320 and so on.

The semiconductor fins 210a and 210b are formed on the P-type well region PW. The semiconductor fins 210a and 210b are separated from each other by the STI 320. The semiconductor fins 210a and 210b are made of the same material. Unlike the semiconductor fins 215a and 215b, the semiconductor fins 210a and 210b do not include Ge.

The gate electrode 220a is formed over the gate dielectric layer 335 and is positioned over a top surface of the semiconductor fins 210a, 210b, 215a and 215b. In some embodiments, the spacers 338 (shown in FIG. 7B) are formed on opposite sides of the gate electrode 335 and between the gate dielectric layer 335 and the Inter-Layer Dielectric (ILD) layer 330. Each of the semiconductor fins 215a and 215b overlapping the gate electrode 235, e.g., the second portions 215a_2 and 215b_2, may serve as a SiGe channel region of the PMOS transistor P5. Thus, the gate electrode 220a and the gate dielectric layer 335 over the semiconductor fins 215a and 215b form a gate structure for the PMOS transistor P5. Furthermore, each of the semiconductor fins 210a and 210b overlapping the gate electrode 220a may serve as a Si channel region of the NMOS transistor N5. Thus, the gate electrode 220a and the gate dielectric layer 335 over the semiconductor fins 210a and 210b form a gate structure for the NMOS transistor N5. In some embodiments, the gate electrode 220a is made of conductive material, such as aluminum (Al), copper (Cu), tungsten (W), titanium (Ti), tantalum (Ta), or other applicable materials.

The gate dielectric layer 335 may be a single layer or multiple layers. The gate dielectric layer 335 is made of silicon oxide (SiOx), silicon nitride (SixNy), silicon oxynitride (SiON), dielectric material(s) with high dielectric constant (high-k), or a combination thereof. In some embodiments, the gate dielectric layer 335 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

The ILD 330 is formed over the STI 320. The gate contact 255a is formed over the metal electrode 220a. In some embodiments, the ILD layer 330 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

Figure 7B:
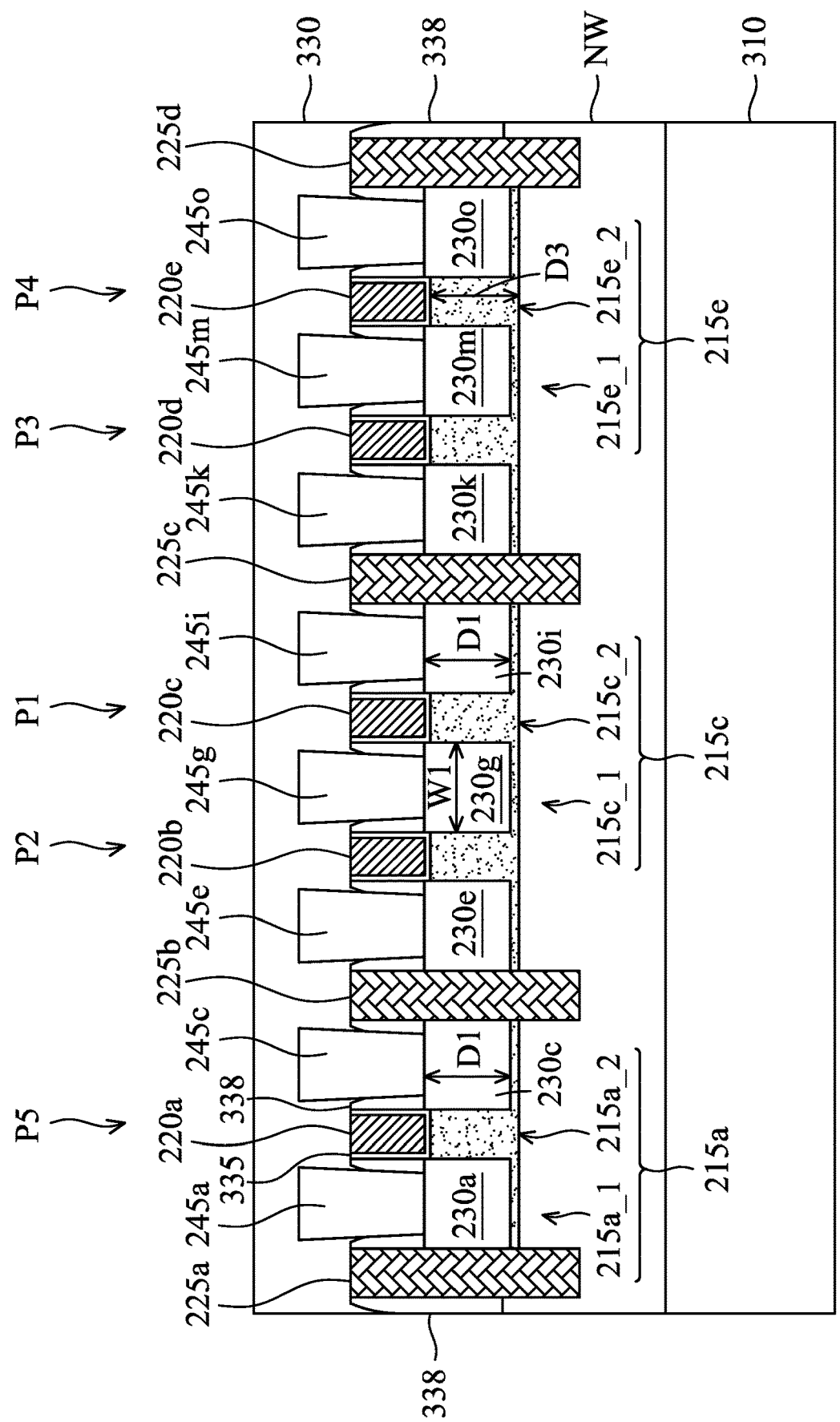
FIG. 7B illustrates a cross-sectional view of the semiconductor structure of the logic array along line B-BB in FIG. 6, in accordance with some embodiments of the disclosure.

FIG. 7B illustrates a cross-sectional view of the semiconductor structure of the logic array 112a_1 along line B-BB in FIG. 6, in accordance with some embodiments of the disclosure. The N-type well region NW is formed over the semiconductor substrate 310. The semiconductor fins 215a, 215c and 215e are formed on the N-type well region NW. As described above, the semiconductor fin 215a includes a first portion 215a_1 and a second portion 215a_2. Similarly, the semiconductor fin 215c includes a first portion 215c_1 and a second portion 215c_2, and the semiconductor fin 215e includes a first portion 215e_1 and a second portion 215e_2. The semiconductor fins 215a, 215c and 215e are separated from each other by the dielectric-base dummy gates 225a and 225c. In some embodiments, the depth D3 of the second portions 215a_2, 215c_2, and 215e_2 of the semiconductor fins 215a, 215c and 215e is from about 30 nm to about 90 nm.

The source/drain regions 230a and 230c of the PMOS transistor P5 are formed by the P-type doping regions on the semiconductor fin 215a. The contacts 245a and 245c are formed over the source/drain regions 230a and 230c, respectively. The source/drain regions 230e, 230g and 230i of the PMOS transistors P2 and P1 are formed by the P-type doping regions on the semiconductor fin 215c. The contacts 245e, 245g and 245i are formed over the source/drain regions 230e, 230g and 230i, respectively. The source/drain regions 230k, 230m and 230o of the PMOS transistors P3 and P4 are formed by the P-type doping regions on the semiconductor fin 215e. The contacts 245k, 245m and 245o are formed over the source/drain regions 230k, 230m and 230o, respectively.

In some embodiments, the source/drain silicide regions (not shown) are formed on the source/drain regions 230a, 230c, 230e, 230g, 230i, 230k, 230m and 230o. In some embodiments, each of the contacts 245a, 245c, 245e, 245g, 245i, 245k, 245m and 450o includes a metal plug (not shown) and a high-K dielectric (not shown) formed on the sidewall of the metal plug. In other words, the metal plug is surrounded by the high-K dielectric. In order to simplify the description, the source/drain silicide regions, the metal plugs, and the high-K dielectric are omitted.

The gate electrode 220a is formed over the gate dielectrics 335 and is positioned over a top surface of the second portion 215a_2 of the semiconductor fin 215a and between the source/drain regions 230a and 230c. The second portion 215a_2 of the semiconductor fin 215a overlapping the gate electrode 220a, may serve as a SiGe channel region of the PMOS transistor P5. Furthermore, the spacers 338 are formed on opposite sides of the gate electrode 220a. Thus, the gate electrode 220a, the corresponding gate dielectrics 335 and the corresponding spacers 338 over the second portion 215a_2 of the semiconductor fin 215a form a gate structure for the PMOS transistor P5.

The gate electrode 220b is formed over the gate dielectrics 335 and is positioned over a top surface of the second portion 215c_2 of the semiconductor fin 215c and between the source/drain regions 230e and 230g. The second portion 215c_2 of the semiconductor fin 215c overlapping the gate electrode 220b, may serve as a SiGe channel region of the PMOS transistor P2. Furthermore, the spacers 338 are formed on opposite sides of the gate electrode 220b. Thus, the gate electrode 220b, the corresponding gate dielectrics 335 and the corresponding spacers 338 over the second portion 215c_2 of the semiconductor fin 215c form a gate structure for the PMOS transistor P2.

The gate electrode 220c is formed over the gate dielectrics 335 and is positioned over a top surface of the second portion 215c_2 of the semiconductor fin 215c and between the source/drain regions 230g and 230i. The second portion 215c_2 of the semiconductor fin 215c overlapping the gate electrode 220c, may serve as a SiGe channel region of the PMOS transistor P1. The gate electrode 220c, the corresponding gate dielectrics 335 and the corresponding spacers 338 over the second portion 215c_2 of the semiconductor fin 215c form a gate structure for the PMOS transistor P1.

The gate electrode 220d is formed over the gate dielectrics 335 and is positioned over a top surface of the second portion 215e_2 of the semiconductor fin 215e and between the source/drain regions 230k and 230m. The second portion 215e_2 of the semiconductor fin 215e overlapping the gate electrode 220d, may serve as a SiGe channel region of the PMOS transistor P3. The gate electrode 220d, the corresponding gate dielectrics 335 and the corresponding spacers 338 over the second portion 215e_2 of the semiconductor fin 215e form a gate structure for the PMOS transistor P3.

The gate electrode 220e is formed over the gate dielectrics 335 and is positioned over a top surface of the second portion 215e_2 of the semiconductor fin 215e and between the source/drain regions 230m and 230o. The second portion 215e_2 of the semiconductor fin 215e overlapping the gate electrode 220e, may serve as a SiGe channel region of the PMOS transistor P4. The gate electrode 220e, the corresponding gate dielectrics 335 and the corresponding spacers 338 over the second portion 215e_2 of the semiconductor fin 215e form a gate structure for the PMOS transistor P4.

In some embodiments, the source/drain regions 230a, 230c, 230e, 230g, 230i, 230k, 230m and 230o include SiGe with Boron epitaxy growth material (i.e., boron-doped SiGe). In some embodiments, the Ge atomic concentration of the source/drain regions 230a, 230c, 230e, 230g, 230i, 230k, 230m and 230o is from about 30% to about 75%. Furthermore, the source/drain regions of the NMOS transistors N1 through N3 are formed by epitaxy material, and the epitaxy material is selected from a group consisting of SiP, SiC, SiPC, SiAs, Si, and combinations thereof. In some embodiments, the depth D1 of the source/drain regions 230a, 230c, 230e, 230g, 230i, 230k, 230m and 230o is from about 40 nm to 70 nm. Furthermore, the width W1 of the source/drain regions 230a, 230c, 230e, 230g, 230i, 230k, 230m and 230o is greater than the SiGe channel regions of the PMOS transistors P1 through P5. For example, the semiconductor fin 215c overlapping the gate electrode 220c, may serve as the SiGe channel region of the PMOS transistor P1, and the SiGe channel region of the PMOS transistor P1 is narrower than the width W1 of the source/drain region 230g.

In some embodiments, the Ge atomic concentration in the SiGe channel regions of the PMOS transistors P1 through P5 is from 5% to 45%. In some embodiments, the Ge atomic concentration of the source/drain regions 230a, 230c, 230e, 230g, 230i, 230k, 230m and 230o is greater than the Ge atomic concentration in the SiGe channel regions of the PMOS transistors P1 through P5.

Similar to the gate electrodes 220a, 220c and 220e, the spacers 338 are formed on opposite sides of each of the dielectric-base dummy gates 225a through 225d. Furthermore, the dielectric-base dummy gates 225a through 225d are located upon the edge of the semiconductor fins 215a, 215c and 215e. The semiconductor fins 215a and 215c are separated by the dielectric-base dummy gate 225b, and the semiconductor fins 215c and 215e are separated by the dielectric-base dummy gate 225c. Furthermore, the dielectric-base dummy gates 225a through 225d are deeper than the source/drain regions 230a, 230c, 230e, 230g, 230i, 230k, 230m and 230 and the second portions 215a_2, 215c_2, and 215e_2 of the semiconductor fins 215a, 215c and 215e. In some embodiments, the width of the dielectric-base dummy gates 225a through 225d is substantially the same as that of the gate electrodes 220a through 220e.

The dielectric-base dummy gates 225a through 225d are formed by a single dielectric layer or multiple dielectric layers with material selected from a group consisting of $SiO_2$, SiOC, SiON, SiOCN, Carbon oxide, Nitrogen oxide, Carbon and Nitrogen oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal oxide, or a combination thereof.

In some embodiments, each gate structure of the gate electrodes 220a through 220e includes multiple material structure selected from a group consisting of poly gate/SiON structure, metals/high-K dielectric structure, Al/refractory metals/high-K dielectric structure, silicide/high-K dielectric structure, or a combination thereof.

Figure 8:
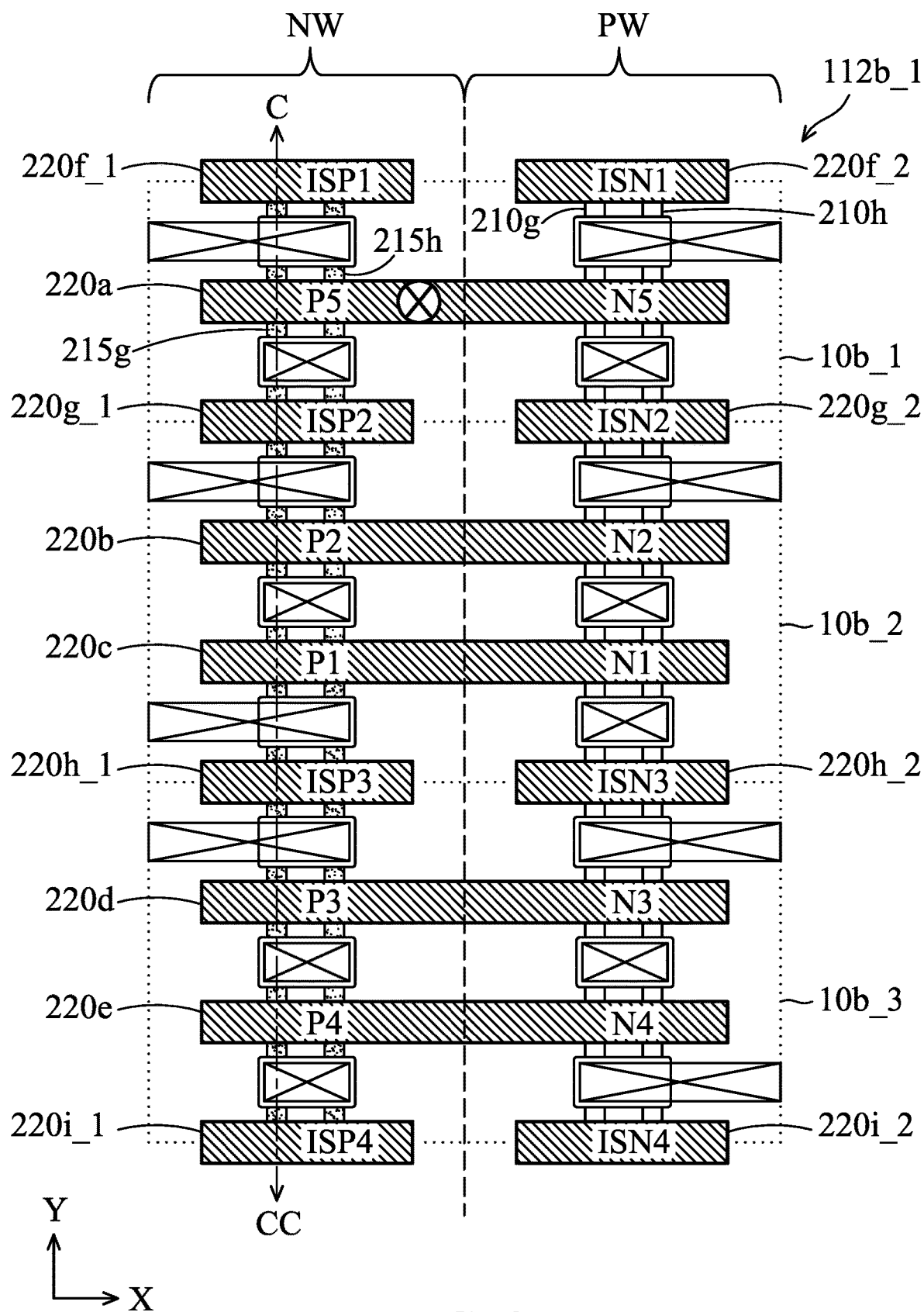
FIG. 8 illustrates the layout of the semiconductor structure of a cell array, in accordance with some embodiments of the disclosure.

FIG. 8 illustrates the layout of the semiconductor structure of a cell array 112b_1, in accordance with some embodiments of the disclosure. The logic array 112b_1 includes the logic cells 10b_1, 10b_2 and 10b_3 arranged in the same column. In some embodiments, the standard cell INV of FIGS. 5A and 5B is implemented in the logic cell 10b_1, the standard cell NAND of FIGS. 3A and 3B is implemented in the logic cell 10b2, and the standard cell NOR of FIGS. 4A and 4B is implemented in the logic cell 10b_3. The transistors of the logic cells 10b_1 through 10b_3 are dual-fin FETs. Furthermore, the outer boundary of each of the logic cells 10b_1 through 10b_3 is illustrated using dashed lines.

In various embodiments, the columns in the logic array 112b_1 may include more logic cells 10b or fewer logic cells 10b than the layout shown in FIG. 8. In various embodiments, the logic array 112b_1 may include more rows or fewer rows and more columns or fewer columns than the layout shown in FIG. 8. Each logic cell 10b provides a circuit or portion thereof, exemplary functionality provided by the logic cells 10b includes, but are not limited to NAND circuit, a NOR circuit, AND circuit, XOR circuit, XNOR circuit, SACN, an inverter, a flip-flop, a latch, and/or other suitable logic or storage functions.

The configuration of logic cells 10b_1 through 10b_3 in the logic array 112b_1 of FIG. 8 is similar to the configuration of logic cells 10a_1 through 10a_3 in the logic array 112a_1 of FIG. 6. The difference between the logic array 112b_1 and the logic array 112a_1 is that the semiconductor fins 210g and 210h and the semiconductor fins 215g and 215h are continuous fin lines in the logic cells 10b_1 through 10b_3. In other words, the semiconductor fins 210g and 210h are shared by the NMOS transistors N1 through N5, and the semiconductor fins 215g and 215h are shared by the PMOS transistors P1 through P5. Therefore, the semiconductor fins 210g and 210h and the semiconductor fins 215g and 215h do not broken by any dielectric-base gates 225.

Multiple dummy gate electrodes are arranged on the cell boundary of two adjacent logic cells, so as to form the isolation transistors (e.g., the isolation NMOS transistors ISN and the isolation PMOS transistors ISP in FIG. 2B).

In the logic array 112b_1, the dummy gate electrode 220g_1 is positioned between the logic cells 10b_1 and 10b_2 and over the N-type well region NW, and the semiconductor fins 215g and 215h overlapping the dummy gate electrode 220g_1, may serve as the SiGe channel regions of the isolation PMOS transistor ISP2. Furthermore, the dummy gate electrode 220g_2 is positioned between the logic cells 10b_1 and 10b_2 and over the P-type well region PW, and the semiconductor fins 210g and 210h overlapping the dummy gate electrode 220g_2, may serve as the Si channel regions of the isolation NMOS transistors ISN2. Similarly, the dummy gate electrode 220h_1 is positioned between the logic cells 10b_2 and 10b_3 and over the N-type well region NW, and the semiconductor fins 215g and 215h overlapping the dummy gate electrode 220h_1, may serve as the SiGe channel regions of the isolation PMOS transistors ISP3. Furthermore, the dummy gate electrode 220h_2 is positioned between the logic cells 10b_2 and 10b_3 and over the P-type well region PW, and the semiconductor fins 210g and 210h overlapping the dummy gate electrode 220h_2, may serve as the Si channel regions of the isolation NMOS transistors ISN3.

In some embodiments, other cell logics (not shown) are adjacent to the logic cell 10b_1/10b_3 in the same column. Thus, the semiconductor fins 215g and 215h overlapping the dummy gate electrode 220f_1, may serve as the SiGe channel regions of the isolation PMOS transistors ISP1, and the semiconductor fins 210g and 210h overlapping the dummy gate electrode 220f_2, may serve as the Si channel regions of the isolation NMOS transistors ISN1. Moreover, the semiconductor fins 215g and 215h overlapping the dummy gate electrode 220i_1, may serve as the SiGe channel regions of the isolation PMOS transistors ISP4, and the semiconductor fins 210g and 210h overlapping the dummy gate electrode 220i_2, may serve as the Si channel regions of the isolation NMOS transistors ISN4.

In the logic array 112b_1, the dummy gate electrodes 220f_1, 220g_1, 220h_1, and 220i_1 are coupled to an overlying level (not shown) for coupling the power supply VDD. Moreover, the dummy gate electrodes 220f_2, 220g_2, 220h_2, and 220i_2 are coupled to an overlying level (not shown) for coupling the ground VSS.

Figure 9:
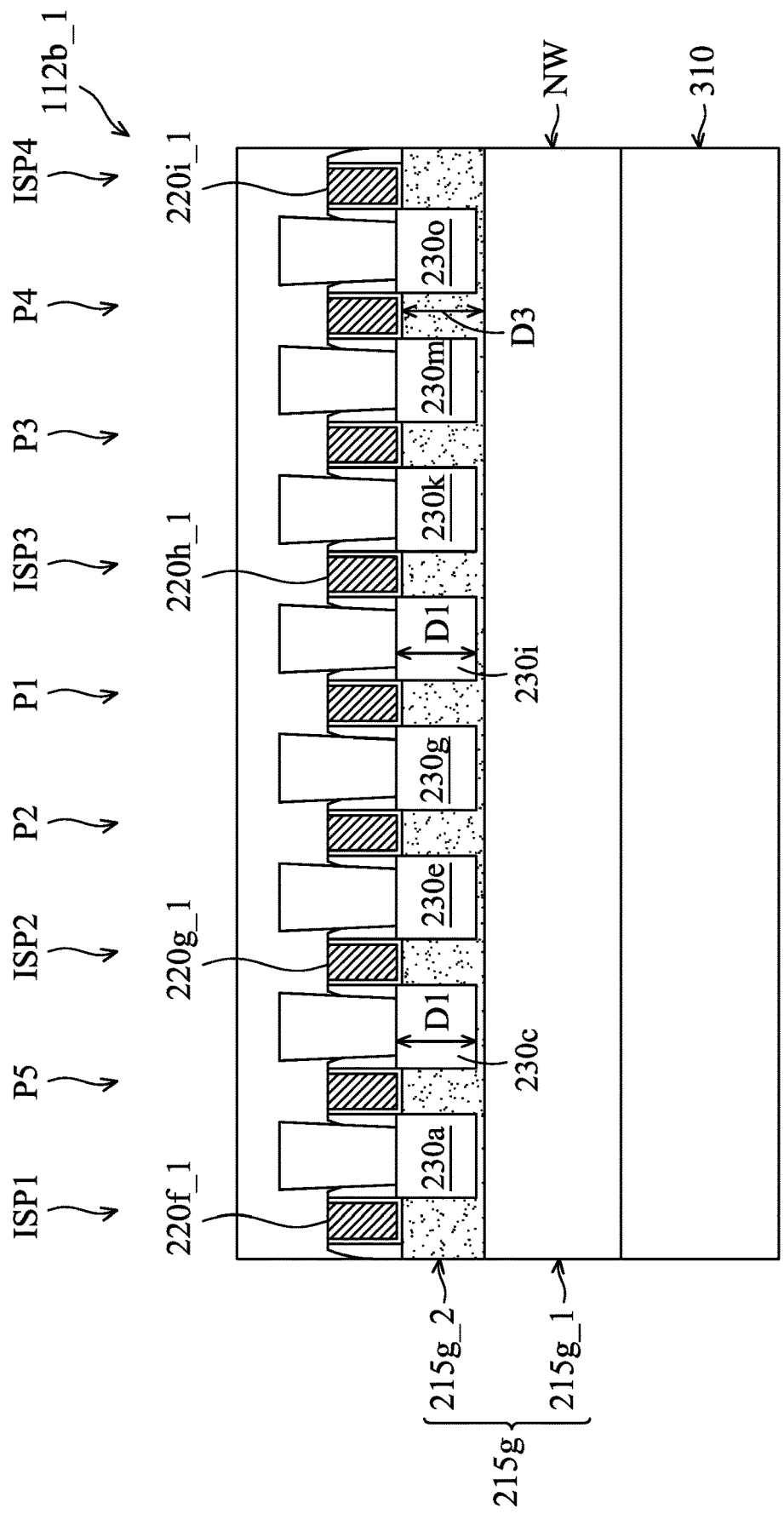
FIG. 9 illustrates a cross-sectional view of the semiconductor structure of the logic array along line C-CC in FIG. 8, in accordance with some embodiments of the disclosure.

FIG. 9 illustrates a cross-sectional view of the semiconductor structure of the logic array 112b_1 along line C-CC in FIG. 8, in accordance with some embodiments of the disclosure. The N-type well region NW is formed over the semiconductor substrate 310. The semiconductor fin 215g is formed on the N-type well region NW. The semiconductor fin 215g includes a first portion 215g_1 and a second portion 215g_2. As described above, the semiconductor fin 215g is a continuous fin line. As described above, the depth D3 of the second portion 215g_2 of the semiconductor fin 215g is from about 30 nm to about 90 nm.

The difference between the logic array 112b_1 of FIG. 9 and the logic array 112a_1 of FIG. 7B is that the dielectric-base dummy gates 225a through 225d in FIG. 7B are replaced with the dummy gate electrodes 220f_1, 220g_1, 220h_1, and 220i_1, respectively. Each gate structure of the dummy gate electrodes 220f_1, 220g_1, 220h_1, and 220i_1 and the two adjacent source/drain regions may form an isolation PMOS transistor ISP. For example, the source/drain regions 230c and 230e and the gate structure of the dummy gate electrode 220g_1 form the isolation PMOS transistor ISP2 between the PMOS transistors P5 and P2, and the source/drain regions 230i and 230k and the gate structure of the dummy gate electrode 220h_1 form the isolation PMOS transistor ISP3 between the PMOS transistors P1 and P3.

Figure 10A:
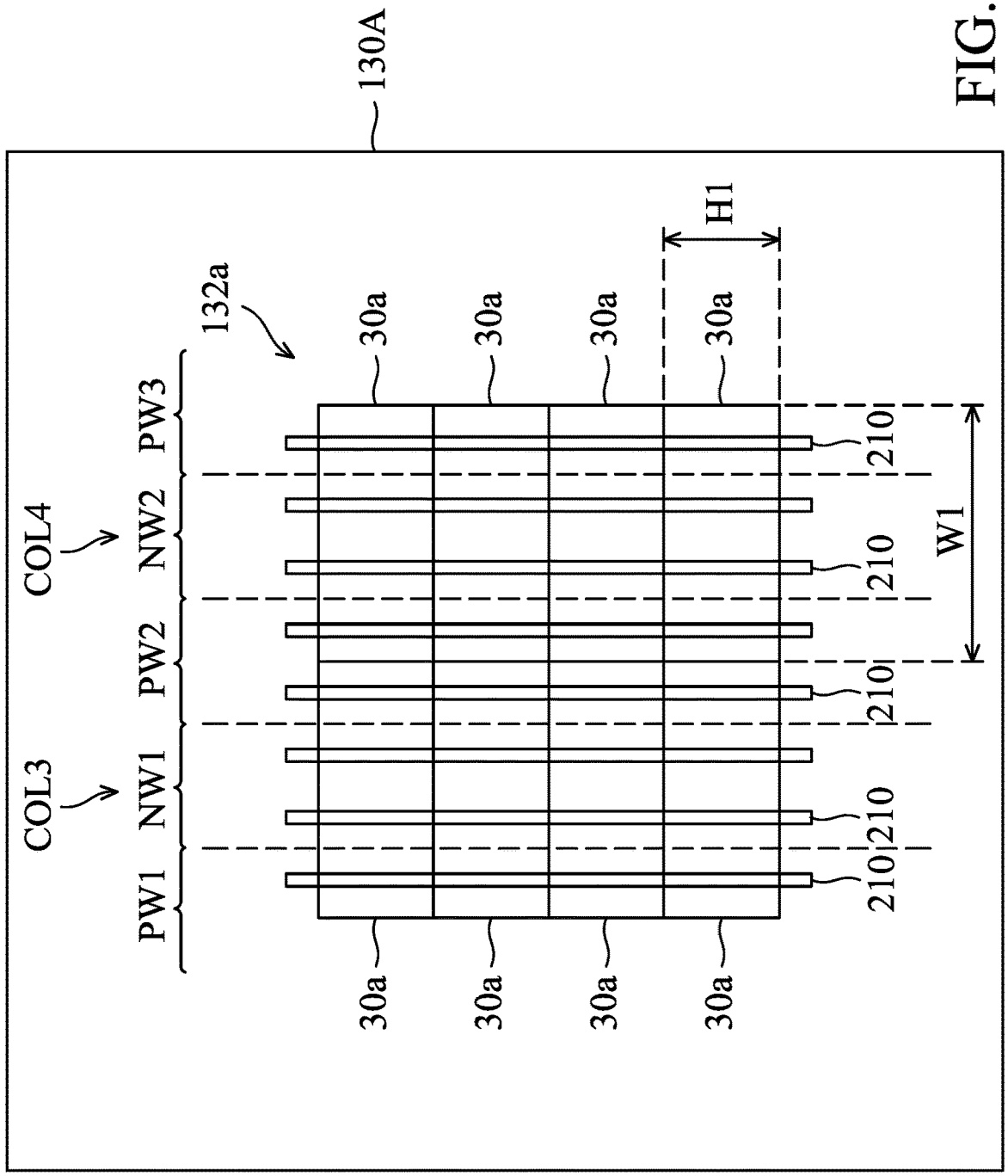
FIG. 10A is a simplified diagram of a memory, in accordance with some embodiments of the disclosure.

FIG. 10A is a simplified diagram of a memory 130A, in accordance with some embodiments of the disclosure. In the memory 130A, multiple memory cells 30a form a memory array 132a, and the memory cells 30a have the same cell width W1 and the same cell height H1. In some embodiments, the memory cell 30a may be a bit cell of SRAM. Furthermore, each memory cell 30a includes multiple transistors, i.e., PMOS and NMOS transistors. The memory cell 30a are described below.

In the memory array 132a, four memory cells 30a are positioned in the column COL3, and four memory cells 30a are positioned in the column COL4. The NMOS transistors of the memory cells 30a in the column COL3 are formed over the P-type well regions PW1 and PW2, and the NMOS transistors of the memory cells 30a in the column COL4 are formed over the P-type well regions PW2 and PW3. Moreover, the PMOS transistors of the memory cells 30a in the column COL3 are formed over the N-type well region NW1, and the PMOS transistors of the memory cells 30a in the column COL4 are formed over the N-type well region NW2.

In various embodiments, the columns in the memory array 132a may include more memory cells 30a or fewer memory cells 30a than the layout shown in FIG. 10A. In various embodiments, the memory array 132a may include more rows or fewer rows and more columns or fewer columns than the layout shown in FIG. 10A.

For the PMOS and NMOS transistors in the memory cells 30a, the channel regions of the transistors are formed by the semiconductor fins 210 extending in the Y-direction. The semiconductor fins 210 are Si-base fins, and the semiconductor fins 210 are continuous fin lines. In some embodiments, the width of the semiconductor fins 210 is from about 3 nm to about 12 nm.

Figure 10B:
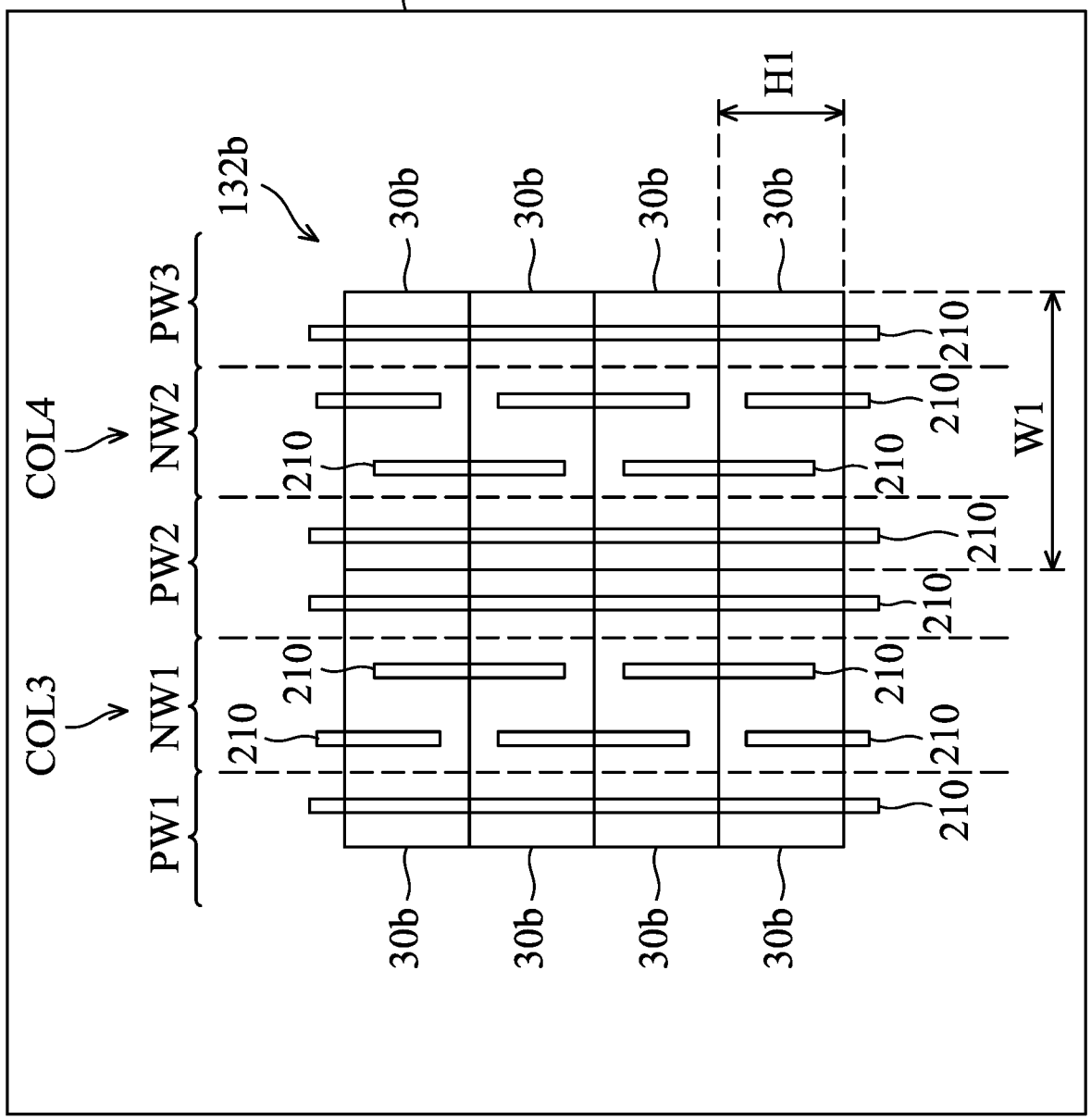
FIG. 10B is a simplified diagram of a memory, in accordance with some embodiments of the disclosure.

FIG. 10B is a simplified diagram of a memory 130B, in accordance with some embodiments of the disclosure. In the memory 130B, multiple memory cells 30b form a memory array 132b, and the memory cells 30b have the same cell width W1 and the same cell height H1. In some embodiments, the memory cell 30b may be a bit cell of SRAM. Furthermore, each memory cell 30b includes multiple transistors, i.e., PMOS and NMOS transistors. The memory cell 30b is described below.

The configuration of memory cells 30b in the memory array 132b of the memory 130B is similar to the configuration of memory cells 30a in the memory array 132a of the memory 130A of FIG. 10A. The difference between the memory array 132b and the memory array 132a is that the semiconductor fins 210 over the N-type well regions NW1 and NW2 are discontinuous fin lines in the memory array 132b. Furthermore, on the N-type well regions NW1 and NW2, each semiconductor fin 210 is shared by the PMOS transistors of two adjacent memory cells 30b in the same column.

In some embodiments, the memory array 132a of FIG. 10A and/or the memory array 132b of FIG. 10B can be implemented in the memory 130 of FIG. 1.

In various embodiments, the columns in the memory array 132b may include more memory cells 30b or fewer memory cells 30b than the layout shown in FIG. 10B. In various embodiments, the memory array 132b may include more rows or fewer rows and more columns or fewer columns than the layout shown in FIG. 10B.

Figure 11A:
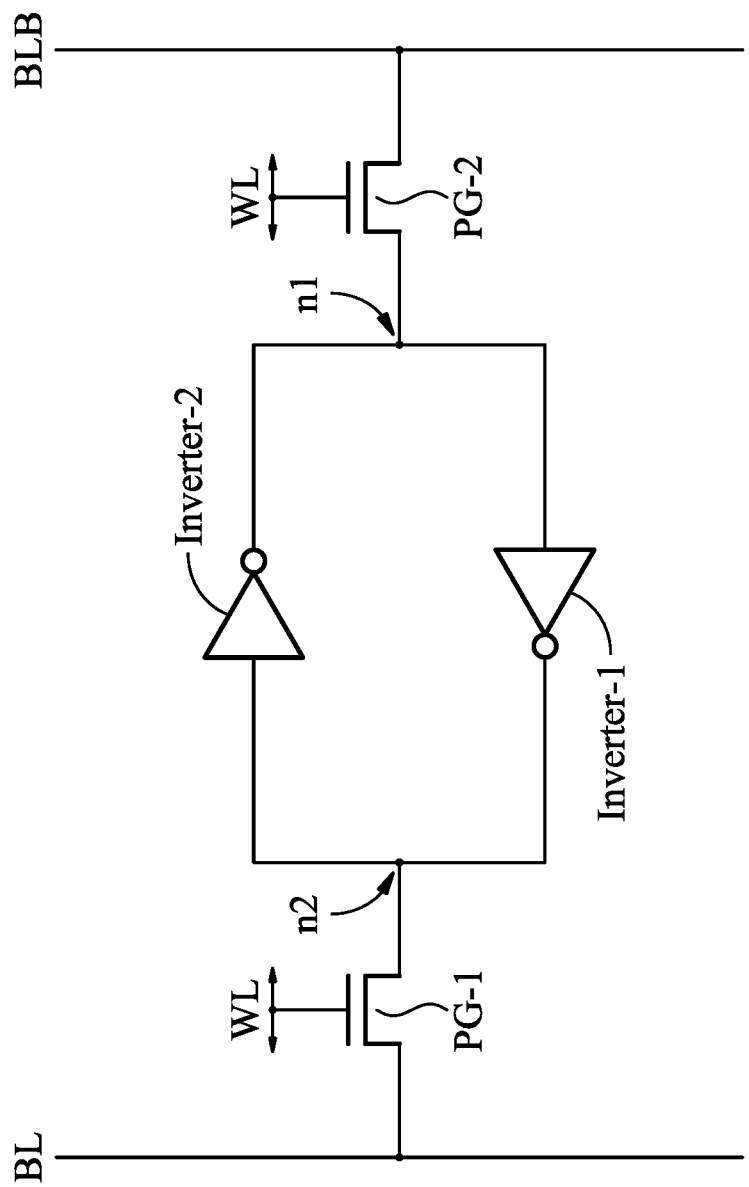
FIG. 11A illustrates a memory cell, in accordance with some embodiments of the disclosure.

FIG. 11A illustrates a memory cell 30 (or 30a/30b), in accordance with some embodiments of the disclosure. In this embodiment, the memory cell 30 is a single-port SRAM bit cell. The memory cell 30 includes a pair of cross-coupled inverters Inverter-1 and Inverter-2, and two pass-gate transistors PG-1 and PG-2. The inverters Inverter-1 and Inverter-2 are cross-coupled between the nodes n2 and n1, and form a latch. The pass-gate transistor PG-1 is coupled between a bit line BL and the node n2, and the pass-gate transistor PG-2 is coupled between a complementary bit line BLB and the node n1, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

Figure 11B:
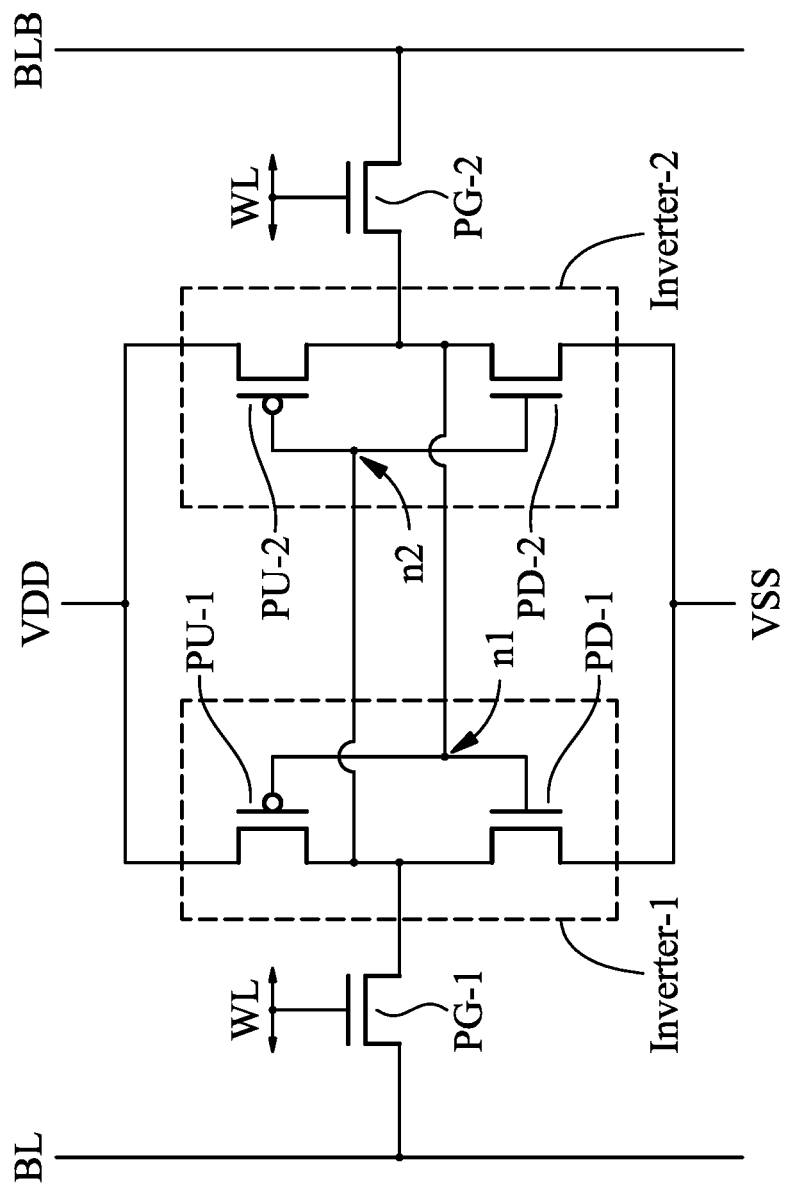
FIG. 11B shows a simplified diagram of the memory cell of FIG. 11A, in accordance with some embodiments of the disclosure.

FIG. 11B shows a simplified diagram of the memory cell 30 of FIG. 11A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node n2 connecting the pass-gate transistor PG-1. The gates of the pull-up transistor PU-1 and the pull-down transistor PD-1 are coupled to the node n1 connecting the pass-gate transistor PG-2. Furthermore, the source of the pull-up transistor PU-1 is coupled to the power supply VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node n1 connecting the pass-gate transistor PG-2. The gates of the pull-up transistor PU-2 and the pull-down transistor PD-2 are coupled to the node n2 connecting the pass gate transistor PG-1. Furthermore, the source of the pull-up transistor PU-2 is coupled to the power supply VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the memory cell 30 are FinFETs. In some embodiments, the pass-gate transistors PG-1 and PG-2 and the pull-down transistors PD-1 and PD-2 are the single-fin FETs, and the pull-up transistors PU-1 and PU-2 are the single-fin FETs or the dual-fin FETs.

Figure 12:
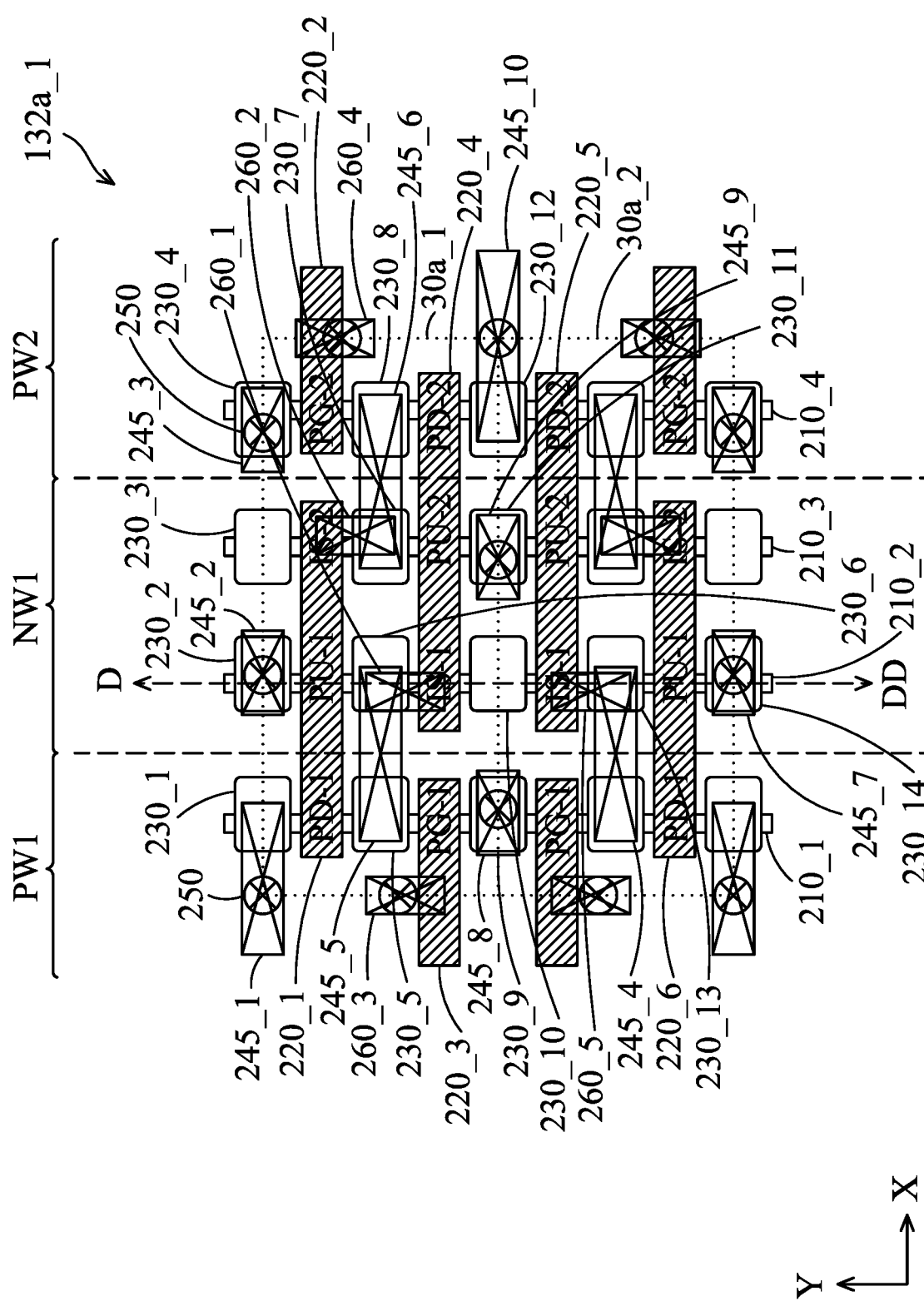
FIG. 12 illustrates the layout of the semiconductor structure of a memory array, in accordance with some embodiments of the disclosure.

FIG. 12 illustrates the layout of the semiconductor structure of a memory array 132a_1, in accordance with some embodiments of the disclosure. The memory array 132a_1 includes the memory cells 30a_1 and 30a_2 arranged in the same column, and the memory cells 30a_1 and 30a_2 are single-port SRAM bit cells of FIGS. 11A and 11B. The memory array 132a_1 can be implemented in the memory 130 of FIG. 1. The outer boundary of each of the memory cells 30a_1 and 30a_2 is illustrated using dashed lines. Furthermore, the two memory cells 30a_1 and 30a_2 are arranged in mirror symmetry along the X-direction.

In various embodiments, the columns in the memory array 132a_i may include more memory cells 30a or fewer memory cells 30a than the layout shown in FIG. 12. In various embodiments, the memory array 132a_1 may include more rows or fewer rows and more columns or fewer columns than the layout shown in FIG. 12.

An N-type well region NW1 is at the middle of memory cells 30a_1 and 30a_2, and two P-type well regions PW1 and PW2 are on opposite sides of N-type well region NW1. The semiconductor fin 210_1 extending in the Y-direction is a continuous Si-base fin line formed over the P-type well region PW1, and the semiconductor fin 210_4 extending in the Y-direction is a continuous Si-base fin line formed over the P-type well region PW2. Moreover, the semiconductor fins 210_3 and 210_4 extending in the Y-direction are the continuous Si-base fin lines formed over the N-type well region NW1.

The gate electrode 220_1 forms the pull-up transistor PU-1 with an underlying semiconductor fin 210_2 over the N-type well region NW1. The gate electrode 220_1 further forms the pull-down transistor PD-1 with the underlying semiconductor fin 2101 in P-type well region PW1. In other words, the gate electrode 220_1 is shared by the pull-up transistor PU-1 and the pull-down transistor PD-1. The gate electrode 220_3 forms the pass-gate transistor PG-1 with the semiconductor fin 210_1. In other words, the semiconductor fin 2101 is shared by the pass-gate transistor PG-1 and the pull-down transistor PD-1. Furthermore, the gate electrode 220_3 is coupled to the corresponding via 250 through the contact 260_3. The contact 260_3 is a butt contact, and includes a portion over, and electrically connected to, the gate electrode 220_3.

The gate electrode 220_4 forms the pull-up transistor PU-2 with an underlying semiconductor fin 210_3 over the N-type well region NW1. The gate electrode 220_4 further forms the pull-down transistor PD-2 with an underlying semiconductor fin 210_4 in the P-type well region PW2. In other words, the gate electrode 220_4 is shared by the pull-up transistor PU-2 and the pull-down transistor PD-2. The gate electrode 220_2 forms the pass-gate transistor PG-2 with the underlying semiconductor fin 210_4. In other words, the semiconductor fin 210_4 is shared by the pass-gate transistor PG-2 and the pull-down transistor PD-2. Furthermore, the gate electrode 2202 is coupled to the corresponding via 250 through the contact 260_4. The contact 260_4 is a butt contact, and includes a portion over, and electrically connected to, the gate electrode 220_2.

The contacts 245_1 and 245_10 are used to connect to the source/drain regions 230_1 and 230_12 of the pull-down transistors PD-1 and PD-2 to the VSS lines (e.g., the ground VSS) through the corresponding vias 250. The contacts 245_1 and 245_10 have lengthwise directions parallel to the X direction, and may be formed to overlap the corners of the memory cells 30a_1 and 30a_2. The contacts 245_2 and 245_9 are used to connect to the source/drain regions 230_2 and 230_11 of pull-up transistors PU-1 and PU-2 to the VDD lines (e.g., the supply voltage VDD) through the corresponding vias 250. Additionally, the contact 245_8 is used to connect to the source/drain region 230_9 of pass-gate transistor PG-1 to a bit line BL through the corresponding via 250. The contact 245_3 is used to connect to the source/drain region 230_4 of the pass-gate transistor PG-2 to a complementary bit line BLB through the corresponding via 250.

The contact 245_6 is a longer contact, and is elongated and has a longitudinal direction in the X direction, which is parallel to the extending directions of the gate electrodes 220_1 through 220_4. The contact 260_2 is a butt contact, and includes a portion over, and electrically connected to, the gate electrode 220_1. In the manufacturing of the memory cell 30a_1 on the semiconductor wafers, the contact 260_2 and the contact 245_6 may be formed as a single continuous butt contact. The source/drain region 230_7 of the pull-up transistor PU-2 is coupled to the source/drain region 230_8 of the pull-down transistor PD-2 and the pass-gate transistor PG-2 through the contact 245_6. Moreover, the contact 2456 is coupled to the gate electrode 220_1 through the contact 260_2.

The contact 245_5 is a longer contact, and is elongated and has a longitudinal direction in the X direction. The contact 260_1 is a butt contact, and includes a portion over, and electrically connected to, the gate electrode 220_4. In the manufacturing of the memory cell 30a_1 on the semiconductor wafers, the contact 260_1 and the contact 245_5 may be formed as a single continuous butt contact. The source/drain region 230_6 of the pull-up transistor PU-1 is coupled to the source/drain region 230_5 of the pull-down transistor PD-1 and the pass-gate transistor PG-1 through the contact 245_5. Moreover, the contact 2455 is coupled to the gate electrode 220_4 through the contact 260_1.

In some embodiments, the gate structure of the gate electrode 220_4 and the source/drain regions 230_6 and 230_10 form the isolation PMOS transistor IS_1. The semiconductor fin 210_2 overlapping the gate electrode 2204, may serve as the Si channel regions of the isolation PMOS transistor IS_1. Furthermore, the gate structure of the gate electrode 220_1 and the source/drain regions 230_3 and 230_7 form the isolation PMOS transistor IS_2. The semiconductor fin 210_3 overlapping the gate electrode 220_1, may serve as the Si channel regions of the isolation PMOS transistor IS_2.

Figure 13:
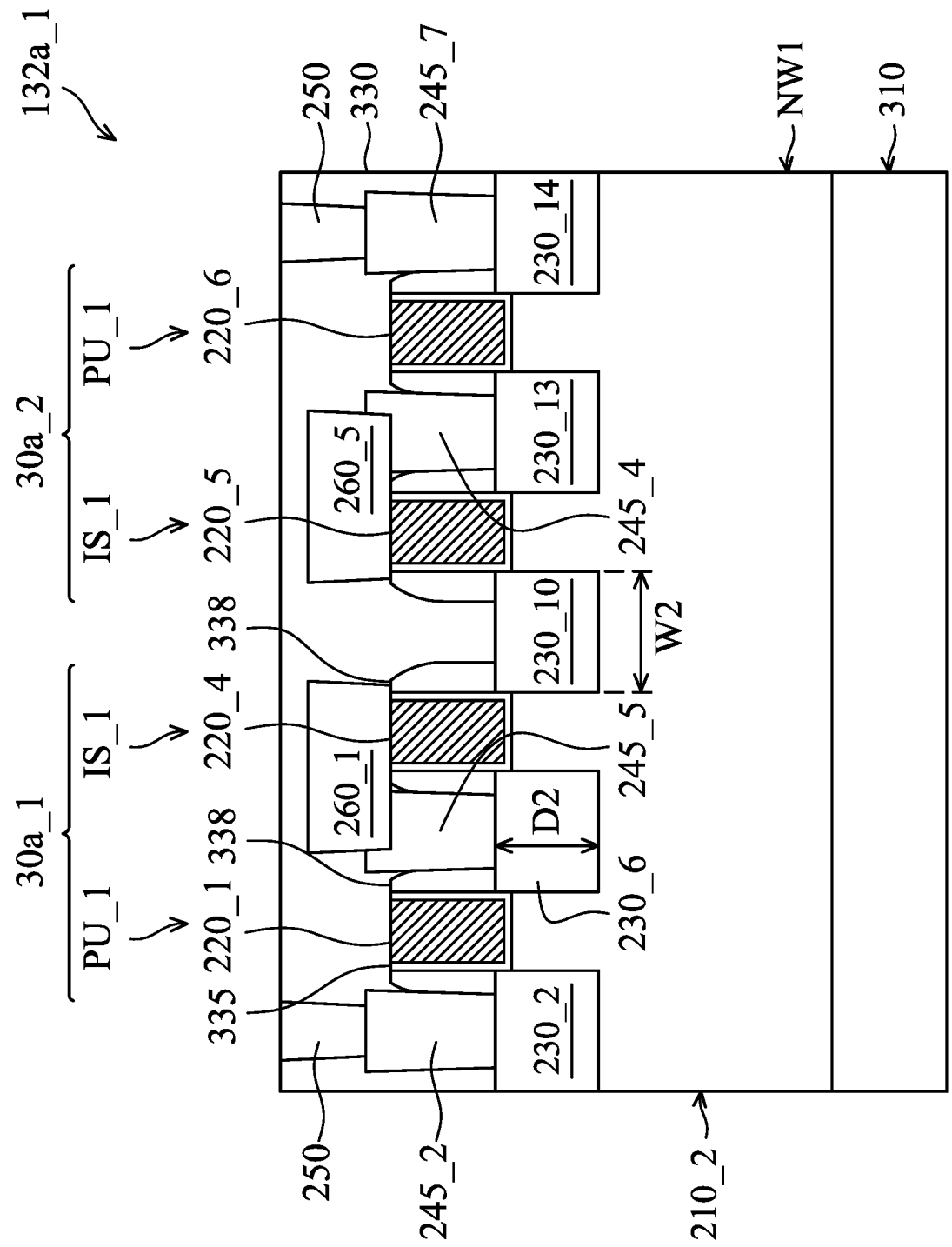
FIG. 13 illustrates a cross-sectional view of the semiconductor structure of the memory array along line D-DD in FIG. 12, in accordance with some embodiments of the disclosure.

FIG. 13 illustrates a cross-sectional view of the semiconductor structure of the memory array 132a_1 along line D-DD in FIG. 12, in accordance with some embodiments of the disclosure. The N-type well region NW1 is formed over the semiconductor substrate 310. The semiconductor fin 210_2 is formed on the N-type well region NW1.

In the memory cell 30a_1, the source/drain regions 230_2 and 230_6 of the pull-up transistor PU-1 are formed by the P-type doping regions on the semiconductor fin 210_2. The contacts 245_2 and 245_5 are formed over the source/drain regions 230_2 and 2306, respectively. The source/drain regions 230_6 and 230_10 of the isolation PMOS transistor IS_1 are formed by the P-type doping regions on the semiconductor fin 210_2. Furthermore, no contact is formed over the source/drain region 230_10.

In the memory cell 30a_2, the source/drain regions 230_14 and 230_13 of the pull-up transistor PU-1 are formed by the P-type doping regions on the semiconductor fin 210_2. The contacts 245_7 and 245_4 are formed over the source/drain regions 230_14 and 230_13, respectively. The source/drain regions 230_13 and 230_10 of the isolation PMOS transistor IS_1 are formed by the P-type doping regions on the semiconductor fin 210_2. As described above, no contact is formed over the source/drain region 230_10.

In some embodiments, the source/drain silicide regions (not shown) are formed on the source/drain regions 2302, 2306, 230_10, 230_13 and 230_14. In some embodiments, each of the contacts 245_2, 2455, 245_4 and 245_7 includes a metal plug (not shown) and a high-K dielectric (not shown) formed on the sidewall of the metal plug. In other words, the metal plug is surrounded by the high-K dielectric. In order to simplify the description, the source/drain silicide regions, the metal plugs, and the high-K dielectric will be omitted.

The gate electrode 220_1 is formed over the gate dielectrics 335 and is positioned over a top surface of the semiconductor fin 210_2 and between the source/drain regions 230_2 and 230_6. The semiconductor fin 210_2 overlapping the gate electrode 220_1, may serve as a Si channel region of the pull-up transistor PU-1. Furthermore, the spacers 338 are formed on opposite sides of the gate electrode 220_1. Thus, the gate electrode 220_1, the corresponding gate dielectrics 335 and the corresponding spacers 338 over the semiconductor fin 210_2 form a gate structure for the pull-up transistor PU-1.

The gate electrode 220_4 is formed over the gate dielectrics 335 and is positioned over a top surface of the semiconductor fin 210_2 and between the source/drain regions 230_6 and 230_10. The semiconductor fin 210_2 overlapping the gate electrode 2204, may serve as a Si channel region of the isolation PMOS transistor IS_1. Furthermore, the gate electrode 220_4 is coupled to the contact 245_5 through the contact 260_1. As described above, The contact 260_1 is a butt contact, and includes a portion over, and electrically connected to, the gate electrode 220_4.

In such embodiments, the configurations of the isolation PMOS transistor IS_1 and pull-up transistor PU-1 in the memory cell 30a_2 may be similar to the isolation PMOS transistor IS_1 and pull-up transistor PU-1 in the memory cell 30a_1, respectively, and are not repeated herein for simplicity.

In some embodiments, the source/drain regions 2302, 2306, 230_10, 230_13 and 230_14 include boron-doped SiGe. In some embodiments, the Ge atomic concentration of the source/drain regions 2302, 2306, 230_10, 230_13 and 230_14 is from about 30% to about 75%. Furthermore, the source/drain regions of the pass-gate transistors PG-1 and PG-2 and the pull-down transistors PD-1 and PD-2 are formed by epitaxy material, and the epitaxy material is selected from a group consisting of SiP, SiC, SiPC, SiAs, SiAsP, Si, and combinations thereof. In some embodiments, the depth D2 of the source/drain regions 2302, 2306, 230_10, 230_13 and 230_14 is from about 35 nm to 65 nm. Furthermore, the width W2 of the source/drain regions 2302, 230_6, 230_10, 230_13 and 230_14 is greater than the Si channel regions of the pull-up transistors PU-1.

In an IC (e.g., the IC 100 of FIG. 1), the depth D2 (as shown in FIG. 13) of the source/drain regions of the PMOS transistors having the Si channel regions in a memory circuit (e.g., 130 of FIG. 1, 130A of FIG. 10A, and 130B of FIG. 10B) is less (or shallower) than the depth D1 (as shown in FIG. 7B and FIG. 9) of the source/drain regions of the PMOS transistors having the SiGe channel regions in a logic circuit (e.g., 110 of FIG. 1, 110A of FIG. 2A, and 110B of FIG. 2B), i.e., D2<D1. In some embodiments, the depth D1 is from about 40 nm to 70 nm, and the depth D2 is from about 35 nm to 65 nm. In some embodiments, the difference between the depth D1 and the depth D2 is greater than 3 nm. In some embodiments, the difference between the depth D1 and the depth D2 is from about 3 nm to 15 nm. In some embodiments, the difference between the depth D1 and the depth D2 is greater than 5%. In some embodiments, the difference between the depth D1 and the depth D2 is from about 5% to about 30%.

Figure 14:
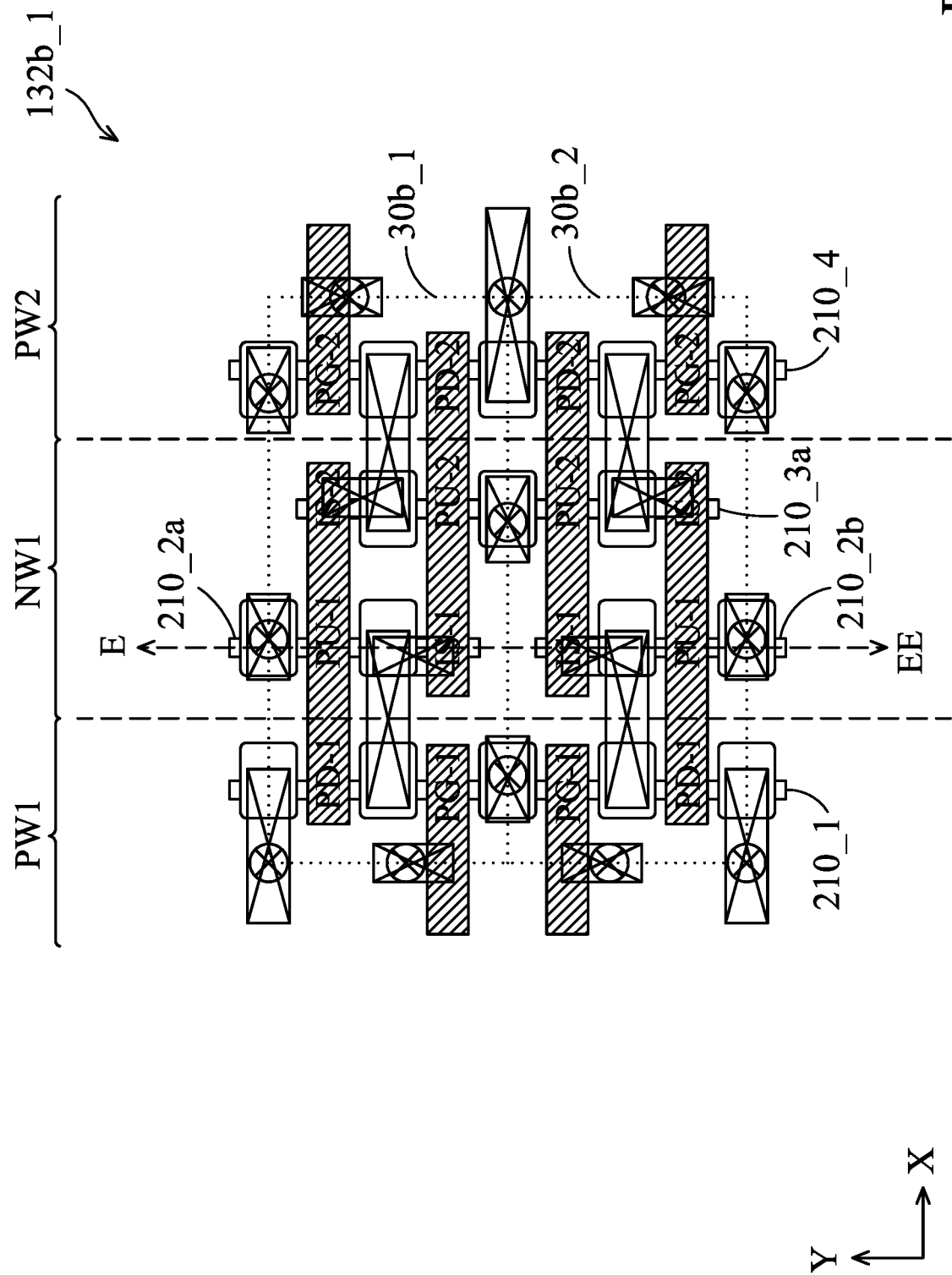
FIG. 14 illustrates the layout of the semiconductor structure of a memory array, in accordance with some embodiments of the disclosure.

FIG. 14 illustrates the layout of the semiconductor structure of a memory array 132b_1, in accordance with some embodiments of the disclosure. The memory array 132b_1 includes the memory cells 30b_1 and 30b_2 arranged in the same column, and the memory cells 30b_1 and 30b_2 are single-port SRAM bit cells of FIGS. 11A and 11B. The memory array 132b_1 can be implemented in the memory 130 of FIG. 1. The outer boundary of each of the memory cells 30b_1 and 30b_2 is illustrated using dashed lines. Furthermore, the two memory cells 30b_1 and 30b_2 are arranged in mirror symmetry along the X-direction.

In various embodiments, the columns in the memory array 132b_1 may include more memory cells 30b or fewer logic cells 30b than the layout shown in FIG. 14. In various embodiments, the memory array 132b_1 may include more rows or fewer rows and more columns or fewer columns than the layout shown in FIG. 14.

The configuration of memory cells 30b_1 and 30b_2 in the memory array 132b_1 of FIG. 14 is similar to the configuration of memory cells 30a_1 and 30a_2 in the memory array 132a_1 of FIG. 12. The difference between the memory array 132b_1 and the memory array 132a_1 is that the semiconductor fins 210_2a, 210_2b and 210_3a are discontinuous fin lines over the N-type well region NW1. Thus, no isolation transistor is formed on the N-type well region NW1. For example, no source/drain regions 230_10 and 230_3 are formed in the memory array 132b_1.

Figure 15:
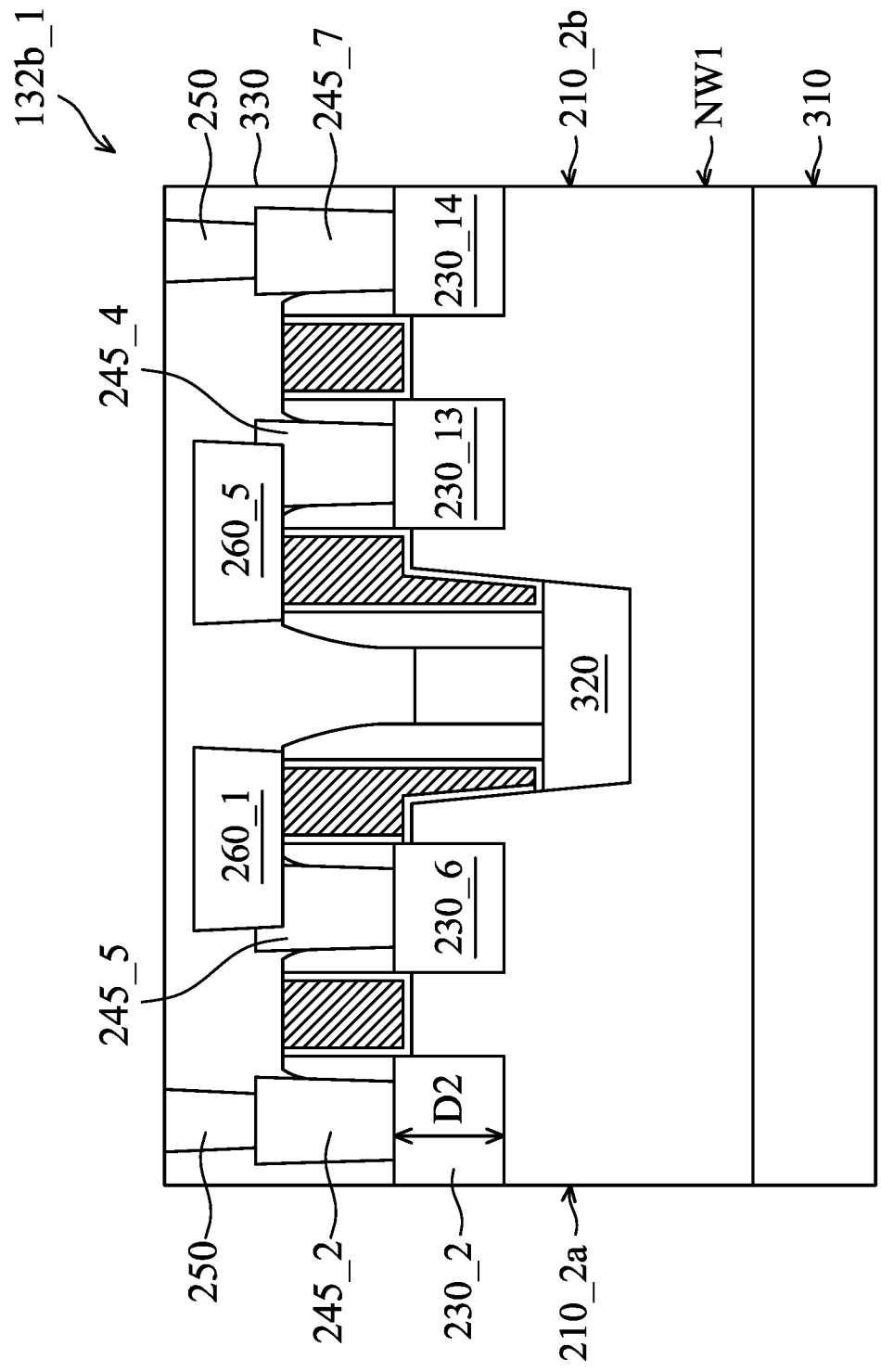
FIG. 15 illustrates a cross-sectional view of the semiconductor structure of the memory array along line E-EE in FIG. 14, in accordance with some embodiments of the disclosure.

FIG. 15 illustrates a cross-sectional view of the semiconductor structure of the memory array 132b_1 along line E-EE in FIG. 14, in accordance with some embodiments of the disclosure. The N-type well region NW1 is formed over the semiconductor substrate 310. The semiconductor fins 210_2a and 210_2b are formed on the N-type well region NW1. The difference between the memory array 132b_1 of FIG. 15 and the memory array 132a_1 of FIG. 13 is that the semiconductor fins 210_2a and 210_2b are separated from each other by the STI 320 in FIG. 15.

Embodiments of ICs including multiple logic cells and multiple SRAM cells are provided. The logic cells include the first P-type FETs including SiGe channels. The first P-type FETs have the deeper junction of the source/drain regions for Ion boost. Furthermore, the SRAM cells include the second P-type FETs (e.g., the pull-up transistor PU-1/PU-2) including Si channels. The second P-type FETs have the shallower junction of the source/drain regions for write margin improvement. For example, the lower alpha ratio (Ion of PU-1/Ion of PG-1) is obtained to gain the cell write margin and without impact the speed or induced extra cost. High channel strain P-type FinFETs (e.g., Ion/Ioff>10% gain) for the standard cells (e.g., the speed driven logic circuit) and high threshold voltage (Vt) P-type FinFETs (that includes purely Si channel without extra channel strain layer) of SRAM cells are provided for write margin improvement as well as low standby requirements. Extra high threshold voltage FinFETs are provided for the SRAM cells and the lower leakage requirement device.

In some embodiments, an integrated circuit (IC) is provided. The IC includes a first P-type FinFET and a second P-type FinFET. The first P-type FinFET includes a silicon germanium channel region. The second P-type FinFET includes a Si channel region. First source/drain regions of the first P-type FinFET are formed on a discontinuous semiconductor fin, and second source/drain regions of the second P-type FinFET are formed on a continuous semiconductor fin. A first depth of the first source/drain regions is different from a second depth of the second source/drain regions.

In some embodiments, an integrated circuit (IC) is provided. The IC includes a logic array and a memory array. The logic array includes a plurality of logic cells arranged in rows and columns, and each of the logic cells includes at least one first P-type fin field-effect transistor (FinFET). The memory array includes a plurality of memory cells arranged in rows and columns, and each of the memory cells includes at least one second P-type FinFET. The first P-type FinFETs of the logic cells arranged in the same column of the logic array share a continuous semiconductor fin, and the continuous semiconductor fin of the first P-type FinFETs and a discontinuous semiconductor fin of the second P-type FinFET of each of the memory cells include different materials. Source/drain regions of the second P-type FinFET are shallower than source/drain regions of the first P-type FinFET.

In some embodiments, an integrated circuit (IC) is provided. The IC includes a plurality of first cells arranged in a first column, and a plurality of second cells arranged in a second column. Each of the first cells includes a plurality of first P-type fin field-effect transistors (FinFETs). Each of the second cells includes a plurality of second P-type FinFETs. The first P-type FinFETs of each of the first cells share a first continuous semiconductor fin, and the second P-type FinFETs of the second cells share a second continuous semiconductor fin. The first and second continuous semiconductor fins are formed by different materials. Source/drain regions of the second P-type FinFETs and source/drain regions of the first P-type FinFETs have different depths.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
    a first P-type FinFET comprising a silicon germanium channel region; and
    a second P-type FinFET comprising a Si channel region,
    wherein first source/drain regions of the first P-type FinFET are formed on a discontinuous semiconductor fin, and second source/drain regions of the second P-type FinFET are formed on a continuous semiconductor fin,
    wherein a first depth of the first source/drain regions is different from a second depth of the second source/drain regions.

2. The IC as claimed in claim 1, wherein the continuous semiconductor fin of the second P-type FinFET and a first portion of the discontinuous semiconductor fin are formed by the same material.

3. The IC as claimed in claim 2, wherein a second portion of the discontinuous semiconductor fin is formed over the first portion of the discontinuous semiconductor fin, and the second portion of the discontinuous semiconductor fin has a third depth that is greater than the first depth.

4. The IC as claimed in claim 1, wherein difference in depth between the first depth and the second depth is greater than 3 nm or 5%.

5. The IC as claimed in claim 1, wherein difference in depth between the first depth and the second depth is from 3 nm to 15 nm or from 5% to 30%.

6. The IC as claimed in claim 1, further comprising:
a logic cell comprising the first P-type FinFET; and
a memory cell comprising the second P-type FinFET.

7. The IC as claimed in claim 1, wherein the first source/drain regions of the first P-type FinFET and the second source/drain regions of the second P-type FinFET comprise boron-doped SiGe.

8. The IC as claimed in claim 7, wherein Ge atomic concentration in the SiGe channel region of the first P-type FinFET is from 5% to 45% and is less than Ge atomic concentration in the first source/drain regions of the first P-type FinFET.

9. An integrated circuit (IC), comprising:
a logic array comprising a plurality of logic cells arranged in rows and columns, wherein each of the logic cells comprises at least one first P-type fin field-effect transistor (FinFET); and
a memory array comprising a plurality of memory cells arranged in rows and columns, wherein each of the memory cells comprises at least one second P-type FinFET,
wherein the first P-type FinFETs of the logic cells arranged in the same column of the logic array share a continuous semiconductor fin, and the continuous semiconductor fin of the first P-type FinFETs and a discontinuous semiconductor fin of the second P-type FinFET of each of the memory cells comprise different materials,
wherein source/drain regions of the second P-type FinFET are shallower than source/drain regions of the first P-type FinFET.

10. The IC as claimed in claim 9, wherein the first P-type FinFETs of two adjacent logic cells positioned in the same column of the logic array are separated by an isolation P-type FinFET with an underlying active region formed by the continuous semiconductor fin.

11. The IC as claimed in claim 9, wherein difference in depth between the source/drain regions of the second P-type FinFET and the source/drain regions of the first P-type FinFET is greater than 3 nm or 5%.

12. The IC as claimed in claim 9, wherein difference in depth between the source/drain regions of the second P-type FinFET and the source/drain regions of the first P-type FinFET is from 3 nm to 15 nm or from 5% to 30%.

13. The IC as claimed in claim 9, wherein the second P-type FinFETs of two adjacent memory cells positioned in the same column of the memory array share the same discontinuous semiconductor fin, and the discontinuous semiconductor fins of the memory cells positioned in the same column of the memory array are separated by a shallow trench isolation.

14. The IC as claimed in claim 9, wherein the logic cells are selected from a group consisting of inverter, NAND, NOR, AND, OR, Flip-Flop, SCAN, or a combination thereof.

15. The IC as claimed in claim 9, wherein the logic array and the memory array each further comprises:
a plurality of N-type FinFETs,
wherein each of the N-type FinFETs comprises a Si channel region, and source/drain regions of the N-type FinFET comprise SiP, SiC, SiPC, SiAs, Si, or a combination thereof.

16. An integrated circuit (IC), comprising:
a plurality of first cells arranged in a first column, wherein each of the first cells comprises a plurality of first P-type fin field-effect transistors (FinFETs); and
a plurality of second cells arranged in a second column, wherein each of the second cells comprises a plurality of second P-type FinFETs,
wherein the first P-type FinFETs of each of the first cells share a first continuous semiconductor fin, and the second P-type FinFETs of the second cells share a second continuous semiconductor fin,
wherein the first and second continuous semiconductor fins are formed by different materials, and
wherein source/drain regions of the second P-type FinFETs and source/drain regions of the first P-type FinFETs have different depths.

17. The IC as claimed in claim 16, wherein the first P-type FinFETs of two adjacent first cells are separated by an isolation P-type FinFET with an underlying active region formed by the first continuous semiconductor fin.

18. The IC as claimed in claim 16, wherein Ge atomic concentration in the first continuous semiconductor fin of the first P-type FinFET is from 5% to 45% and is less than Ge atomic concentration in the source/drain regions of the first P-type FinFET.

19. The IC as claimed in claim 16, wherein the first cells and the second cells each further comprises:
a plurality of N-type FinFETs,
wherein each of the N-type FinFETs comprises a Si channel region,
wherein the discontinuous semiconductor fin comprises SiGe, and the continuous semiconductor fin comprises Si.

20. The IC as claimed in claim 16, wherein the first cells are selected from a group consisting of inverter, NAND, NOR, AND, OR, Flip-Flop, SCAN, or a combination thereof, and the second cells are memory cells.

* * * * *